US008519728B2

(12) United States Patent
Yalei et al.

(10) Patent No.: US 8,519,728 B2
(45) Date of Patent: Aug. 27, 2013

(54) COMPLIANCE CONTROL METHODS AND APPARATUSES

(75) Inventors: Sun Yalei, Singapore (SG); Uday Nayak, San Jose, CA (US)

(73) Assignee: FormFactor, Inc., Livermore, CA (US)

( * ) Notice: Subject to any disclaimer, the term of this patent is extended or adjusted under 35 U.S.C. 154(b) by 872 days.

(21) Appl. No.: 12/334,368

(22) Filed: Dec. 12, 2008

(65) Prior Publication Data

US 2010/0148814 A1    Jun. 17, 2010

(51) Int. Cl.
*G01R 31/20* (2006.01)

(52) U.S. Cl.
USPC ............ 324/758.01; 324/756.01; 324/755.01; 324/713; 318/649; 318/560; 318/561; 318/575; 318/569; 318/567

(58) Field of Classification Search
USPC .................... 324/750.22, 750.19, 750.24–26, 324/754.1, 754.03, 754.11, 756.03, 758, 324/750.24–750.26; 318/649, 560, 561, 318/575, 569, 567
See application file for complete search history.

(56) References Cited

U.S. PATENT DOCUMENTS

| | | | |
|---|---|---|---|
| 5,410,259 A | 4/1995 | Fujihara et al. |
| 5,422,579 A | 6/1995 | Yamaguchi |
| 5,449,985 A | 9/1995 | Kanemitsu et al. |
| 5,473,698 A | 12/1995 | Garnjost et al. |
| 5,515,523 A | 5/1996 | Kalkunte et al. |
| 5,550,483 A | 8/1996 | Boyette et al. |
| 5,644,245 A | 7/1997 | Saitoh et al. |
| 5,793,598 A | 8/1998 | Watanabe et al. |
| 5,814,733 A | 9/1998 | Khoury et al. |
| 6,040,700 A | 3/2000 | Berar |
| 6,096,567 A | 8/2000 | Kaplan et al. |
| 6,111,421 A | 8/2000 | Takahashi et al. |
| 6,213,442 B1 | 4/2001 | Ivers et al. |
| 6,832,143 B2 | 12/2004 | Trudeau et al. |
| 6,906,546 B2 | 6/2005 | Tanioka et al. |
| 6,963,208 B2 * | 11/2005 | Fukasawa et al. ....... 324/750.19 |
| 7,352,198 B2 | 4/2008 | Nayak et al. |

(Continued)

FOREIGN PATENT DOCUMENTS

| | | |
|---|---|---|
| DE | 10 2004 057776 A1 | 7/2005 |
| EP | 1 069 437 A1 | 1/2001 |

(Continued)

OTHER PUBLICATIONS

PCT Notification of Transmittal of the International Search Report and the Written Opinion of this International Searching Authority, or the Declaration; PCT International Search Report; and PCT Written Opinion of the International Searching Authority, International Application No. PCT/US2006/042343 mailed Apr. 4, 2007, total 12 pages.

(Continued)

*Primary Examiner* — Arleen M Vazquez
*Assistant Examiner* — Alesa Allgood
(74) *Attorney, Agent, or Firm* — Blakely, Sokoloff, Taylor & Zafman LLP

(57) ABSTRACT

Methods and apparatuses for modifying a stage position and measuring at least one parameter of a motor connected with a stage during a commanded stage position are described. In one embodiment of one aspect of the invention, the motor is configured to move the stage in a first direction in response to the at least one parameter and determine whether the at least one parameter is within a threshold range.

23 Claims, 13 Drawing Sheets

(56) References Cited

U.S. PATENT DOCUMENTS

| | | | |
|---|---|---|---|
| 7,504,844 B2 * | 3/2009 | Yamada | 324/750.24 |
| 7,622,939 B2 | 11/2009 | Nayak et al. | |
| 7,688,096 B2 * | 3/2010 | Inomata | 324/750.24 |
| 2002/0080041 A1 | 6/2002 | Ohno et al. | |
| 2004/0100297 A1 | 5/2004 | Tanioka et al. | |
| 2005/0083073 A1 | 4/2005 | Nihei et al. | |
| 2005/0253613 A1 | 11/2005 | Komatsu et al. | |

FOREIGN PATENT DOCUMENTS

| | | |
|---|---|---|
| JP | 1-284793 | 11/1989 |
| JP | 11-162828 | 6/1999 |
| JP | 11-190762 | 7/1999 |
| JP | 11-251381 | 9/1999 |
| JP | 2004-152916 | 5/2004 |
| JP | 2006-149659 * | 5/2009 |
| WO | WO 2005031186 A2 | 4/2005 |

OTHER PUBLICATIONS

PCT Notification Concerning Transmittal of Copy of International Preliminary Report on Patentability (Chapter 1 of the Patent Cooperation Treaty), International Application No. PCT/US2006/042478 mailed Jul. 31, 2008, total 10 pages.

* cited by examiner

COMPLIANCE CONTROL METHODS AND APPARATUSES

CROSS-REFERENCE TO RELATED APPLICATIONS

This application is related to U.S. patent application Ser. No. 11/335,081 entitled "Methods and Apparatuses for Improved Stabilization in a Probing System" by Nayak et al., filed on Jan. 18, 2006, which is incorporated herein by reference in its entirety.

FIELD OF THE INVENTION

This invention relates to systems for probing, testing, inspecting, or manufacturing processes, such as a wafer probing and direct write operations, having a plurality of contact points, such as probe tips, designed to make electrical contact with targets such as semiconductor devices or direct write surfaces.

BACKGROUND OF THE INVENTION

Integrated circuits are often manufactured on a semiconductor substrate, such as a silicon wafer. The silicon wafer is typically a thin circular plate of silicon that is 150 or 200 or 300 millimeters in diameter and approximately 2 millimeters thick. Typically, a single wafer will have numerous devices which are integrated circuits formed in a lattice pattern. Each device consists of numerous layers of circuitry and collection of external bonding (and optional testing) pads. The bonding pads are small sites, typically 3 mils square, made usually with aluminum or other metals that eventually serve as the device's connections to the pin leads.

Probing involves contacting the bonding pads with probe tips to make an electrical (resistive) connection between the probe tips and the bonding pads or other pads. Accurate positioning of the pads under, or otherwise relative to, the tips is necessary both to avoid causing damage to the pads and to maintain the desired contact pressure that ensures good electrical contact.

Probe tips move or deform during the operation of probing. This action makes the probe tips scrub or slide across bond pads, balls, contact bumps, or contact surfaces of the wafer being tested. This mechanical action is necessary to break through the contamination and oxide on the probe tips and or the pads. Due to the mechanical action described, undesirable forces can be generated within a system.

SUMMARY OF THE DESCRIPTION

Methods and apparatuses, according to one embodiment, are provided for adjusting a commanded position between a plurality of pads on a wafer device and a plurality of contact electrodes (e.g. pins on a probe card) in response to motor strain created by system forces.

According to one embodiment of an aspect of the invention, a parameter of a motor is measured during a commanded stage position in order to move a stage in a first direction in response to the parameter. The stage may hold a device under testing or inspecting or manufacturing or may hold probe tips or other testing or inspecting or manufacturing components. The stage may be disposed in a variety of orientations.

According to another embodiment of another aspect of the invention, a measurement of the parameter is made after moving the stage in the first direction to determine whether there was an increase or decrease in the at least one parameter.

According to yet another embodiment of another aspect of the invention, the stage is moved in a second direction having a vector component that is opposite to the first direction if the parameter is not within a threshold range.

According to yet another embodiment of another aspect of the invention, a position control system is coupled with the stage and communicates with the motor to modify the commanded position of the stage in response to the parameter.

According to yet another embodiment of another aspect of the invention, a system of modifying a stage position includes a frame, a base supported by the frame, a stage having a commanded position. The system includes a motor having a parameter. The motor is configured to move the stage in a first direction. A position control system is coupled with the stage and configured to communicate with the motor to modify the command position of the stage in response to the parameter. Modifying the command position of the stage results in a change in the parameter that is communicated to the position control system.

The solutions provided by at least certain embodiments of the invention thus results in a system that actively compensates for motor strain and internal forces generated within the system. These and other embodiments, features, aspects, and advantages of the present invention will be apparent from the accompanying drawings and from the detailed description and appended claims which follow.

BRIEF DESCRIPTION OF THE DRAWINGS

The present invention is illustrated byway of example and not limitation in the figures of the accompanying drawings in which like references indicate similar elements and in which.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a through understanding of various embodiments of the present invention. However, in certain instances, well-known or conventional details are not described in order to provide a concise discussion of embodiments of the present inventions.

At least certain embodiments of the invention may be used to test or inspect or manufacture a component such as an integrated circuit or a wafer containing a plurality of integrated circuits or a substrate containing one or more other components. The following description is directed to wafer probing, but it will be understood that wafer probing is merely one example of an embodiment of the invention and that other examples of other embodiments will not be used for wafer probing.

Probing involves contacting the pad surface with probe tips. Probe tips move or deform during the operation of probing. This action makes the probe tips scrub or slide across the bond pads, balls/bumps or contact surfaces of the wafer being tested. This mechanical action is necessary to break through the contamination and oxide on the probe tips and/or the pads. In addition, a large amount of pressure is used to scrub away an oxide or contamination layer.

In one embodiment of the present invention, a prober system consists of two main components, or stages, one holding a wafer and the other a probe card. The two stages move relative to one another and are brought together in order to create the high pressure contact between the bond pads and the probe tips.

Figure 1:
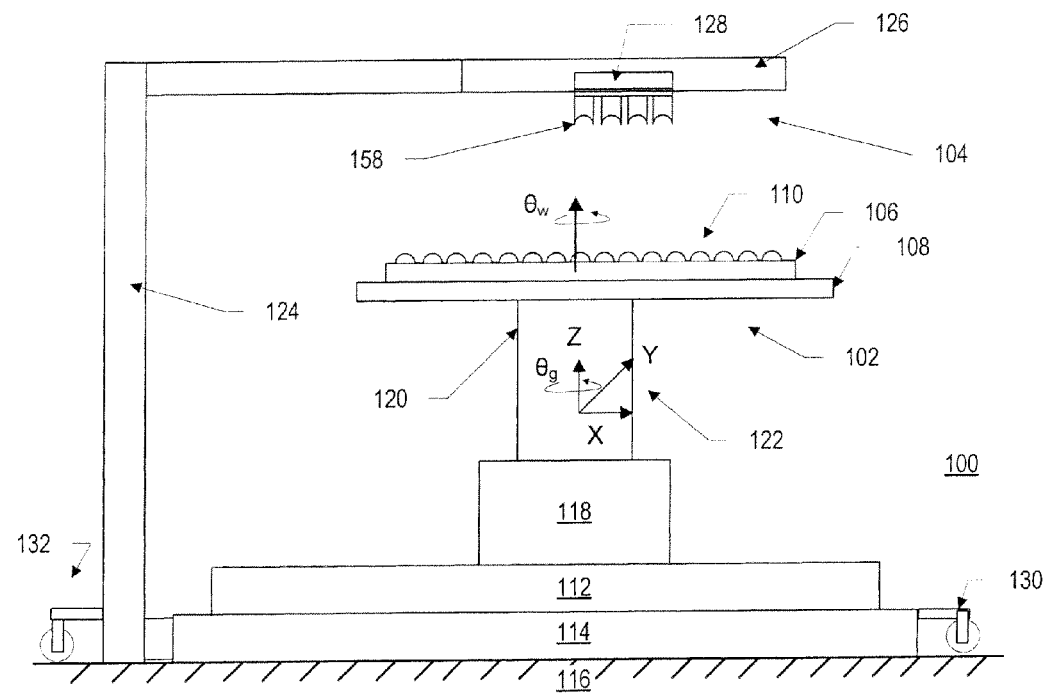
FIG. 1 illustrates a side view of a possible embodiment of a prober testing system and its two main stages.

FIG. 1 shows a schematic of one such possible embodiment of a system 100, comprising of two main stages. The main stages are the wafer holder assembly 102 and the probe-card holder assembly 104. In this illustrative example, the wafer holder assembly (WHA) 102 is capable of motion along the X, Y, Z and $\theta_g$ directions while the probe card holder assembly (PCHA) 104 is held stationary. In another embodiment, the WHA 102 can be held stationary while the PCHA 104 is capable of motion. In yet another embodiment, the WHA 102 and PCHA 104 can both be capable of motion. In addition, the wafer 106 itself can be rotated around the $\theta_w$ direction relative to its holding chuck 108 in the wafer holder assembly 102. In this manner, the wafer 106 being supported by the wafer holder assembly 102 can be moved relative to the probe card pins 158 being supported by the probe-card holder assembly 104 so that the pins 158 can be brought in contact with conductive elements 110 such as pads 110b or balls/bumps 110a on the wafer 106.

The wafer holder assembly 102 is supported by a granite base 112 and a metal frame 114 which is located on a support surface 116. The wafer holder assembly 102 includes a motion system 118, a Z stage 120, and a holding chuck 108. The holding chuck 108, in this embodiment, holds the wafer 106 to present a number of ball contacts 110a for testing. The chuck 108, being movable in the X,Y,Z and $\theta_g$ directions 122, is connected to the Z-stage 120 of the gantry. The X-Y motion system 118, in one embodiment, can be an X-Y gantry system which allows an X stage 138 to move in the X-direction and a Y-stage 146 to move in a Y-direction. The X-Y motion system 118 is connected with a Z stage 120 which is capable of moving in the Z-direction 154 to allow the probe pins 158 to make contact with the pads 110b or balls 110a on the wafer 106. The X-Y motion system 118 is also connected with an encoder to track the position of the Z-stage 120 and wafer 106.

It is also appreciated, in another embodiment, that the Z stage 120 floats above a granite base having a series of evenly distributed air orifices which blow air upwards towards the Z stage 120 in order to help it move smoothly over the granite base 112 and thus alleviate some of the contact friction between the Z stage 120 and the granite base 112.

In another embodiment, the X-Y motion system 118 can also be a sawyer motor system having a smooth platen surface, a magnetized forcer, and driving coils which affect the magnetic flux of the forcer to move the Z stage 120 in an X or Y direction 140,150 over the surface of the platen. In the sawyer motor system, the platen is a non-porous surface so that air bearings mounted to the wafer holder assembly 102 can create a pressurized region between the wafer holder assembly 102 and the platen surface. Air bearings, such as orifice air bearings or porous media bearings, are attached to the lower surface of the Z-stage 120 to blow downward toward the platen thus creating a uniform air gap between the Z-stage 120 and platen.

FIG. 1 further shows a probe card holder assembly 104 which includes a support member or assembly 124, a ring carrier 126, a probe card 128, and probe tips 158. The ring carrier 126 is supported by the support assembly 124 and can be made of a metal such as aluminum or steel. The support assembly 124 is connected with the metal frame 114 which is connected with the granite base 112. In this embodiment, the probe card holder assembly 104 is stationary; however, it is possible to provide the probe card holder assembly 104 with a motion mechanism so that the probe card can move with respect to the wafer holder assembly 102.

The probe card 128 is connected with the probe tips 158 and presents the probe tips 158 for contact with the wafer 106. In this illustrative example, when the Z-stage 120 is actuated, the probe tips 158 come into contact with the conductive elements 110.

The system 100 may be moved on wheels, such as wheels 130 and 132. The wheels 130 and 132 are preferably part of a set of wheels, such as four wheels, although any number of wheels can be used. The wheels can be retracted so that the metal frame 114 and granite base 112 rests on the floor either directly on the floor or by retractable legs. In FIG. 1, the wheels 130 and 132 are in a retracted position although the wheels can be moved into an extended position so that the system 100 can be rolled across the support surface 116 making the system 100 portable.

Figure 2:
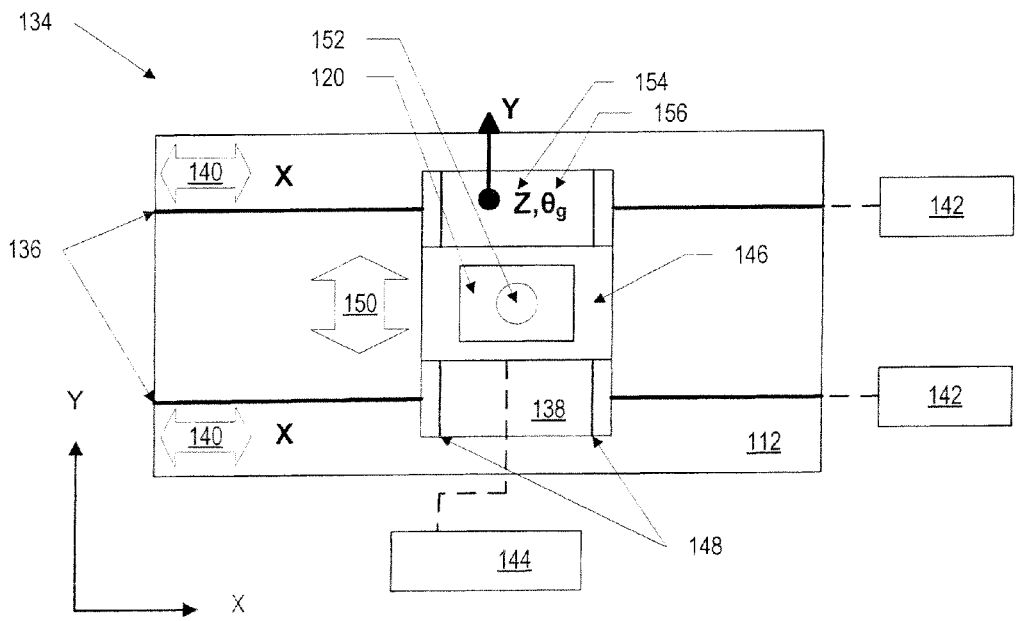
FIG. 2 illustrates a top view of a prober system.

FIG. 2 is a top view of the system 100 shown in FIG. 1. FIG. 2 illustrates an example where the X-Y motion system 118 is an X-Y gantry system 134, as briefly mentioned above. In the X-Y gantry system 134, a set of two X rails 136 allows the Z-stage 120 to move in a linear and low friction manner in the X-direction 140. The X rails 136 channel the motion of the Z-stage 120 so that a motion in the Y-direction is limited or non-existent. A bridge 138 (or X-stage) rests on top of the granite base 112 and X rails 136. The bridge 138 is connected with the Z-stage 120 and it is possible to have the Z-stage 120 be independently supported by air bearings or blow holes. The bridge 138 also is connected with the chuck 108 which holds the wafer 106 and its conductive elements 110 which can be contact pads 110b or balls 110a. The chuck 108 is moved along the X-direction 140 on the X rails 136 with respect to the granite base 112 by two X-motors 142 that are connected with the bridge 138. It is understood that the chuck 108 can be moved in the X-direction 140 by one X-motor, or any number of motors, instead of only two motors. An additional motion mechanism housed in the gantry system can move the chuck 108 in the Y, Z, and theta (θ) directions.

FIG. 2, according to one embodiment, shows an X-Y gantry system 134 comprised of a Y-motor 144 connected with a Y-stage 146 that is connected with two Y-rails 148 that guide the Y-stage 146 in a Y-direction 150. The Z-stage 120 is supported or connected with the Y-stage 146 so that the chuck 108 and wafer 106 (not shown in this view) can also be moved in the Y-direction 150. The Y-motor 144 could be mounted within the X-Y motion system 118 or it could be remotely mounted and connected with the Y-stage 146 to enable the chuck 108 to be moved in the Y-direction 150.

FIG. 2 also shows, according to one embodiment, a rotary motor 152 within the X-Y motion system 118 that is capable of raising the Z-stage 120 in a Z-direction 154 or theta ($\theta_g$) 156 direction. Depending on the specific use of the system, the rotary motor 152 can be replaced or used in combination with piezo-electric elevating mechanisms, linear motors, ball and screw arrangements, slider mechanisms that transfer a lateral force to a vertical force to drive the Z-stage 120 in the Z-direction 154, air bearings, or shape memory alloy material for moving the Z-stage 120 in the Z-direction 154. The rotary motor 152 is preferably mounted within the X-Y motion system 118; however, in another embodiment, the rotary motor 152 can be remotely mounted to drive the Z-stage 120 in the Z-direction 154 or theta 156 direction.

FIGS. 3a-4b show two embodiments of different types of probe pin 158 and conductive element 110 arrangements.

Figure 3A:
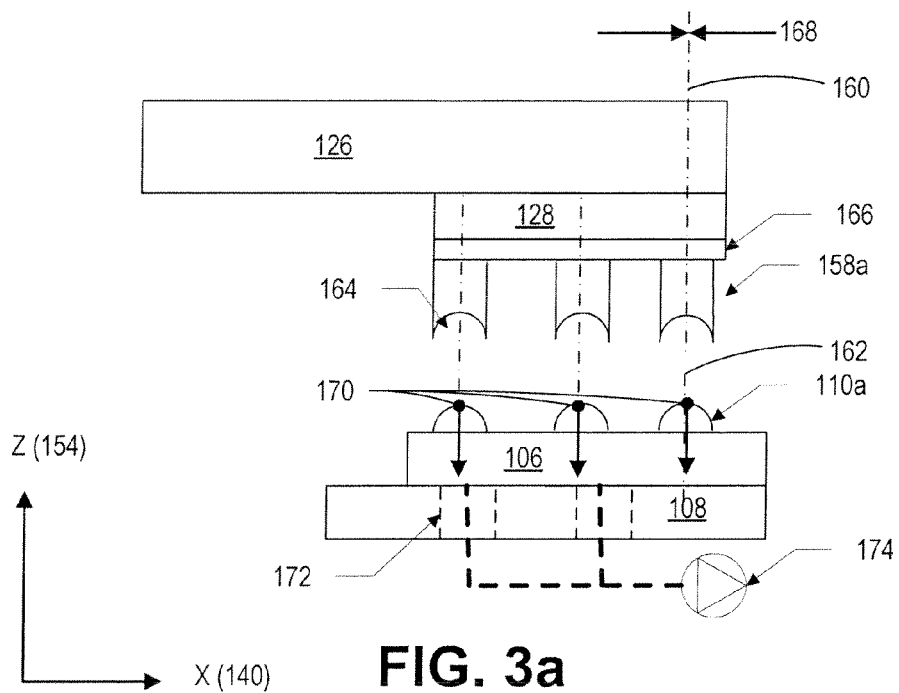
FIG. 3a illustrates a side view of connections between probe pins and conductive elements, according to a possible embodiment.

FIG. 3a shows an embodiment where the ring carrier 126, probe card 128, probe tips or pins 158, and conductive elements 110 are in alignment. The conductive elements 110 are balls 110a, which can be any material such as solder, gold, copper, aluminum, nickel, tungsten, tin, and alloys thereof. The probing tips 158 are recessed shaped pins 158a. The recessed shaped pins 158a have a crater type recess that accommodates the shape of the balls or bumps 110a. The recessed shaped pins 158a are designed to be electrically coupled with the balls or bumps 110a in the Z-direction 154. The recessed shaped pins 158a have a first center axis 160 about which the recessed shaped pin 158a is uniform. The recessed shaped pins 158a are spaced across the lower surface of the probe card 128 from one another. A membrane layer 166 is disposed between the probe card 128 lower surface and the recessed shaped pins 186a. The membrane layer 166 can be an insulating layer or a dielectric material. The spacing between recessed shaped pins 158a can be modified to accommodate uniquely spaced balls or bumps 110a.

Although FIG. 3a shows a recess region 164 being a semi-spherical shape, it is understood that the recess region 164 can be a diamond shape, cubical, or conical shape, or any shape to accommodate the shape of the conductive elements 110. Therefore, it follows that the conductive elements 110 can be semi-spherical, cubical, conical, diamond-shaped or any possible shape that can still maintain an electrical connection between the probe pins 158 and the conductive elements 110.

FIG. 3a shows the ideal alignment between the probe pins 158 and conductive elements 110. The first center axis 160 of the recess shaped pins 158a are in exact alignment with a second center axis 162 of the balls 110a. In this illustration, the offset distance 168 between the first center axis 160 and second center axis 162 is zero for all the recess shaped pins 158a. Thus, when the chuck 108 is raised by the Z-stage 120, the recess region 164 directly accommodates and matches the shape of the balls 110a and creates a perfect connection between the probe card and wafer 106 so that testing or inspection may be conducted. In the illustration of FIG. 3a, only a vertical force 170 in the negative Z-direction 154 is created on the surface of the balls 110a. No lateral forces are generated because the offset distance 168 is zero and the first center axis 160 of the recess shaped pins 158a is perfectly aligned with the second center axis 162 of the balls 110a.

The vertical forces 170 generated in the negative Z-direction 154 have a magnitude in the aggregate within the range of 100-150 kgf (220.46 lbs.-330.69 lbs.). In another embodiment, the downward vertical forces 170 may have a magnitude in the aggregate as low as 50 kgf. The lateral force vector components of vertical force 170 are equal to zero due to the perfect alignment in this illustration.

The wafer 106 is kept stable and aligned on the wafer chuck 108 by a plurality of negatively pressurized holes 172 creating a suction force between the wafer 106 and the chuck 108. The suction holes 172 are connected to a vacuum system such as a vacuum pump or system 174 which creates the suction force necessary to maintain the wafer 106 on the chuck 108.

Figure 3B:
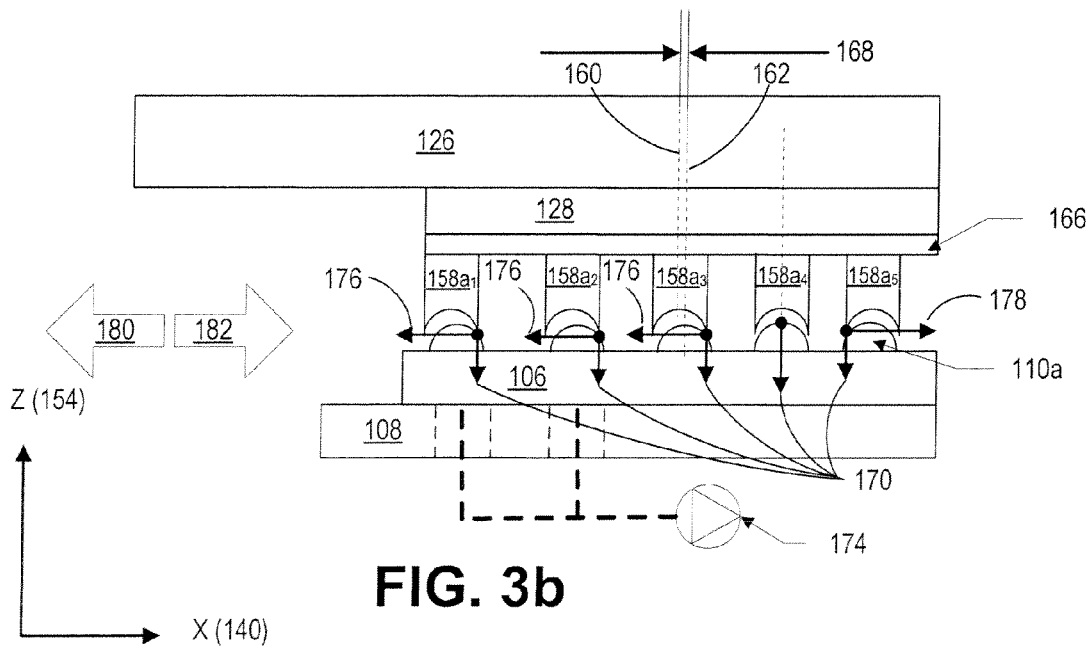
FIG. 3b illustrates a side view of connections between probe pins and conductive elements, according to another possible embodiment.

FIG. 3b shows an embodiment where the Z-stage 120 is moved to a commanded stage position. In this illustration, the recess shaped pins 158a are not in perfect alignment with the conductive elements 110 or balls 110a. Because of the misalignment, an offset distance 168 is present with a value greater than zero, meaning the first center axis 160 of the recess shaped pins 158a are no longer in exact alignment with a second center axis 162 of the balls 110a. As a result, when the Z-stage 120 is moved to create contact between the balls 110a and probe pins 158a, a lateral force component 176,178 is generated. A lateral force component may be generated over time due to thermal expansion of the Z-stage 120, wafer 106, or any components within the system 100.

FIG. 3b illustrates an embodiment where various pins generate various lateral forces. For ease of discussion, the system in FIG. 3b is limited to showing a two dimensional space of X and Z although in reality lateral forces will be created in the X and Y directions 140,150, not only the X-direction 140. Furthermore, the drawings are not to scale and show exaggerated distances to convey the general concept.

FIG. 3b shows a first pin $158a_1$ generating a force on the surface of the semi-spherical ball 110a in the negative X-direction 140 and negative Z-direction 154. The lateral force 176 is created because the recess shaped pin 158a contacts the ball 110a at a point offset and away from the second center axis 162 of the ball 110a. The second and third pins $158a_2$, $158a_3$, also generate a lateral force 176 in the negative X-direction 140 and a downward vertical force 170 in the negative Z-direction 154. The fourth pin 158$a_4$ is still perfectly aligned with the ball 110$a$ and therefore only generates a downward vertical force 170 in the negative Z-direction 154, similar to the illustration in FIG. 3$a$. The fifth pin 158$a_5$ generates a lateral force 178 in the positive X-direction 140 (having a vector component opposite lateral force 176) and a downward force 170 in the negative Z-direction. The vacuum system 174 maintains the wafer 106 in a stable position relative to the chuck 108 as previously mentioned.

In the aggregate, the lateral forces 176 from the first three pins 158$a_1$, 158$a_2$, 158$a_3$ create a first summation force 180 in the negative X-direction 140. The magnitude of a second summation force 182 in the positive X-direction 140 is equal to the lateral force 178 generated on the fifth pin 178$a_5$ because there are no other lateral forces in the positive X-direction 140. The two summation forces 180, 182 are opposite in direction but are not equal. The individual lateral forces 176 from the first three pins 158$a_1$, 158$a_2$, 158$a_3$ create a first summation force 180 magnitude greater than the opposing second summation force 182 thereby causing the wafer holder assembly 102 to shift or be displaced in the negative X-direction 140. In order to counter the total summation force (difference between first and second summation forces 180, 182), the X-motors 142 would strain to keep the wafer holder assembly 102 and Z-stage 120 in a stationary position as will be further discussed in detail. Again, if the total summation force were in the Y-direction 150, the Y-motor 144 would strain to maintain the wafer holder assembly 102 and Z-stage 120 stationary. Furthermore, a total summation force in both the X-direction 140 and Y-direction 150 would cause both X-motors 142 and Y-motors 144 to strain against the total summation force.

Figure 4A:
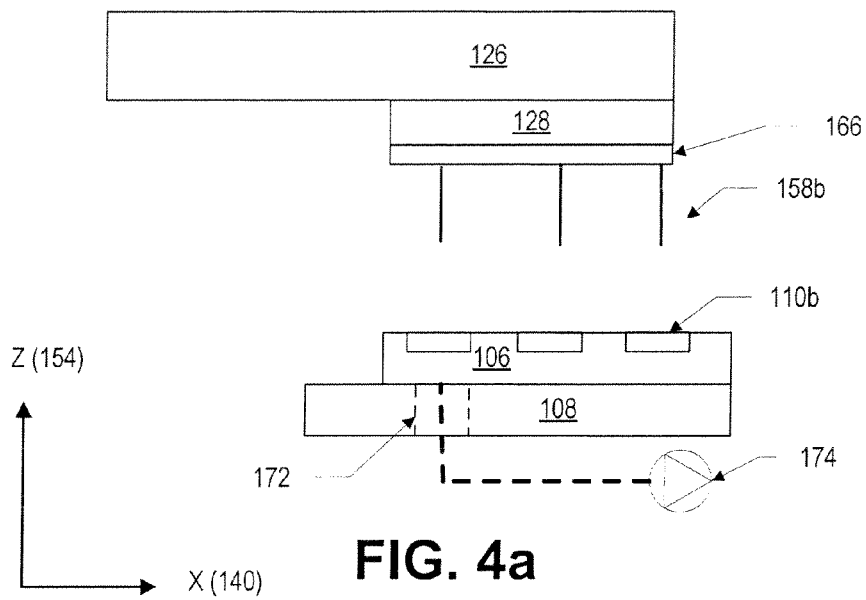
FIG. 4a illustrates a side view of connections between probe pins and conductive elements, according to another possible embodiment.
Figure 4B:
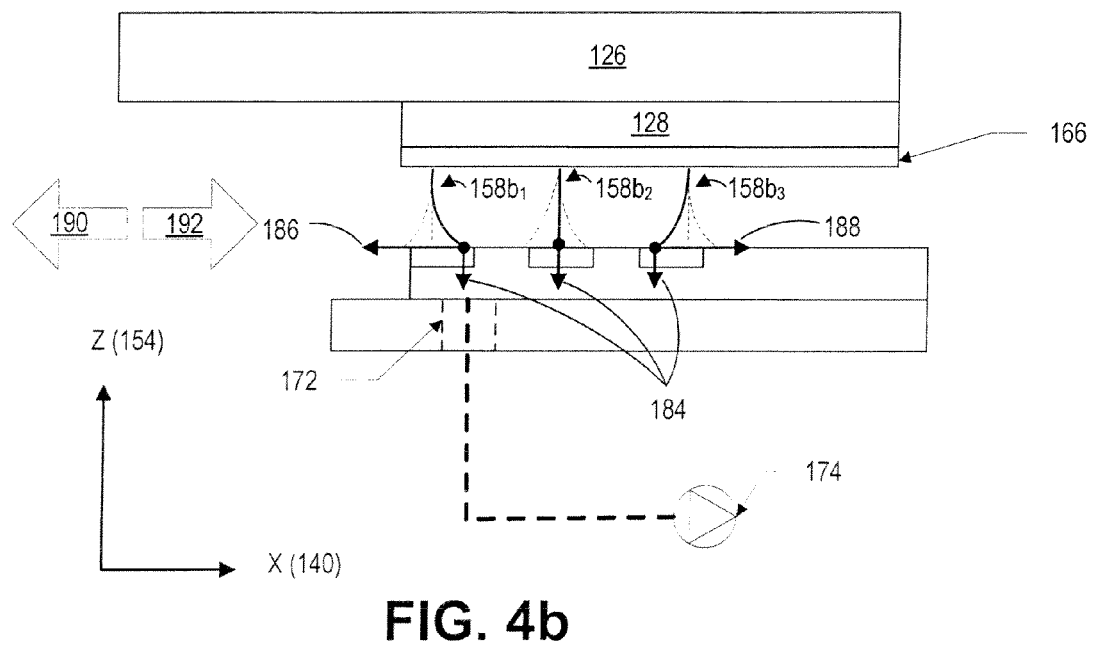
FIG. 4b illustrates a side view of connections between probe pins and conductive elements, according to another possible embodiment.

FIG. 4$a$ illustrates another embodiment where the probe pins 158 are probe needles 158$b$ mounted on a probe card 128 connected with a ring carrier 126. The probe needles 158$b$ are aligned with the contact pads 110$b$ prior to contact so that the probe needles 158$b$ will score the contact pads 110$b$ as previously described. The probe card 128 may have a membrane layer 166 as previously described. The wafer 106 is held stationary relative to the chuck 108 by a plurality of holes 172 within the chuck 108 that are connected with a vacuum system 174.

The contact pads 110$b$ are shown as embedded within the wafer 106 although it is possible to provide a wafer 106 with contact pads 110$b$ raised above a top surface of the wafer 106.

FIG. 4$b$ shows the Z-stage 120 in a commanded stage position where the probe needles 158$b$ contact the contact pads 110$b$. As previously mentioned, the embodiment described is limited to an X-Z coordinate system even though the lateral forces in practice would likely have X and Y force components. Depending on the orientation, stiffness, material, and spring constant of the flexible probe needle 158$b$, a force is generated between the probe needle 158$b$ and the contact pad 110$b$. The probe needles 158$b$ may bend in one direction as indicated by the dark bold lines while the dotted lines in FIG. 4$b$ show other potential positions of the probe needles 158$b$.

The first probe needle 158$b_1$ is bent in a positive X-direction 140 while exerting a force on the contact pad 110$b$ having a lateral and vertical component. The bending force of the first probe needle 158$b_1$ creates a lateral force component 186 in the negative X-direction 140 and a vertical force component 184 in a negative Z-direction 154. The second probe needle 158$b_2$ may contact the contact pad 110$b$ in a manner so as to create zero lateral force. The third probe needle 158$b_3$ may bend in the opposite direction of the first needle creating a lateral force component 188 in the positive X-direction 140 opposite to the first needle 158$b_1$. The third probe needle 158$b_3$ may also exert a vertical downward force 184 on the contact pad 110$b$ in addition to the lateral force 188. It is understood that, in practice, more than three probe needles 158 will be generating forces.

In FIG. 4$b$, if the first summation of forces 190 in the negative X-direction 140 is less than the second summation of forces 192 in the positive X-direction 140, then the wafer holder assembly 102 will be pushed in a positive X-direction 140 causing the X-motors 142 to strain to keep the wafer holder assembly 102 n a stationary position with respect to the granite surface 112. If lateral forces are generated in the X-direction 140 and Y-direction 150, both X-motors 142 and Y-motor 144 will strain to maintain the wafer 106 stationary with respect to the probe card 128.

The amount of lateral force generated between the probe pins 158 and conductive elements 110 is highly dependent on pin compression, friction force, and the manufacturing materials involved. The type of pin, the type of pad, and the orientation of the pins also greatly affect the lateral force generated. For example, the probe needles 158$b$ could be angled at a certain predefined angle between 0° and 90° from the surface of the probe card which would increase or decrease the lateral force generated depending on pure angle of orientation.

In general, the Z-stage 120 receives a first force from a structure (such as probe pins 158) on the component (such as wafer 106) and the force causes a motor parameter to increase over time. The Z-stage 120 also receives a second force (such as vertical force 170) having a vector component in a direction perpendicular to the first direction.

Figure 5:
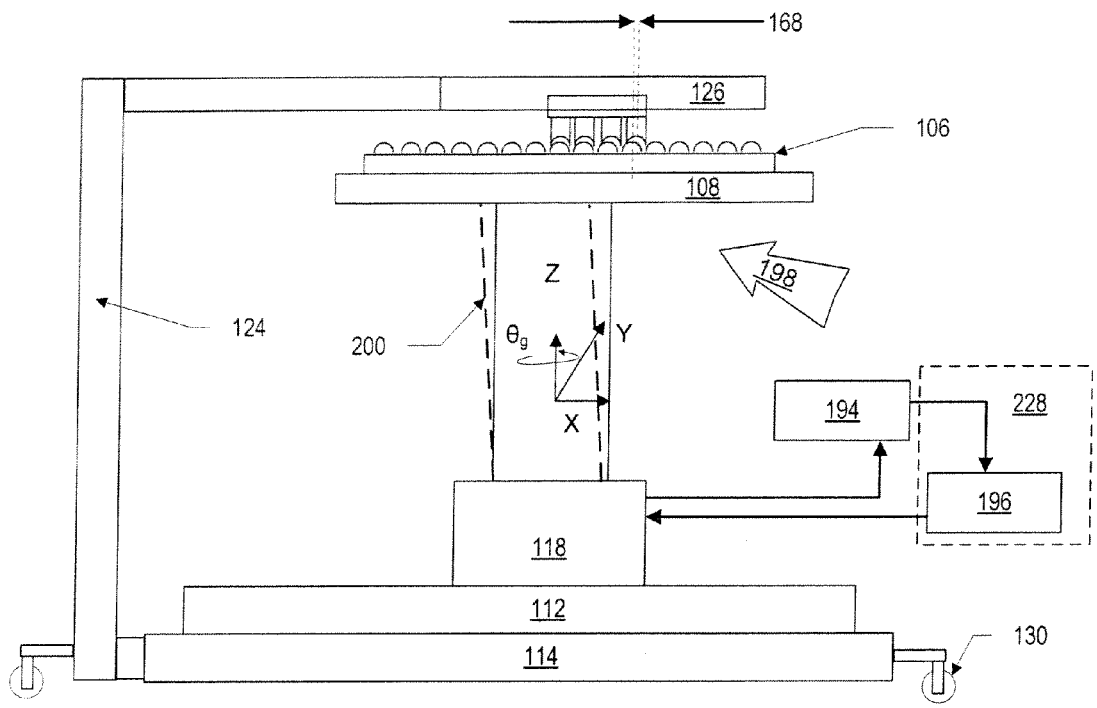
FIG. 5 illustrates a side view of another possible embodiment of a prober testing system and its connection to a position control system.

FIG. 5 illustrates the wafer holder assembly 102 after being moved to a commanded stage position similar to FIG. 3$b$. As the lateral forces 176 generate a summation force 198 in the negative X-direction 140 and positive Y-direction 150, the current (I) 194 of the X-motors 142 and Y-motor 144 are monitored by a monitoring module 196 within a compliance control process 204. The wafer 106 is trapped between the chuck 108 top and the recess shaped pins 158$a$ causing the wafer holder assembly 102 to push or fight with the motors 142,144 which are trying to hold the Z-stage 120 in the commanded position. If the current (I) 194 exceeds an amount for a certain time period, such as 10-50 milliseconds, the motors 142,144 shut down to prevent further damage to the motors and system. If the motors 142,144 are turned off, encoding information is lost which results in the loss of valuable position information of the stages 120,138, 146 and wafer holder assembly 102.

In addition, the lateral forces created may cause the Z-stage 120 to bend in the direction of the lateral forces as shown by the exaggerated dotted lines 200. Although the illustration in FIG. 5 shows a bending in the negative X-direction 140 only, in reality the bending also occurs in a positive Y-direction 150.

Figure 6:
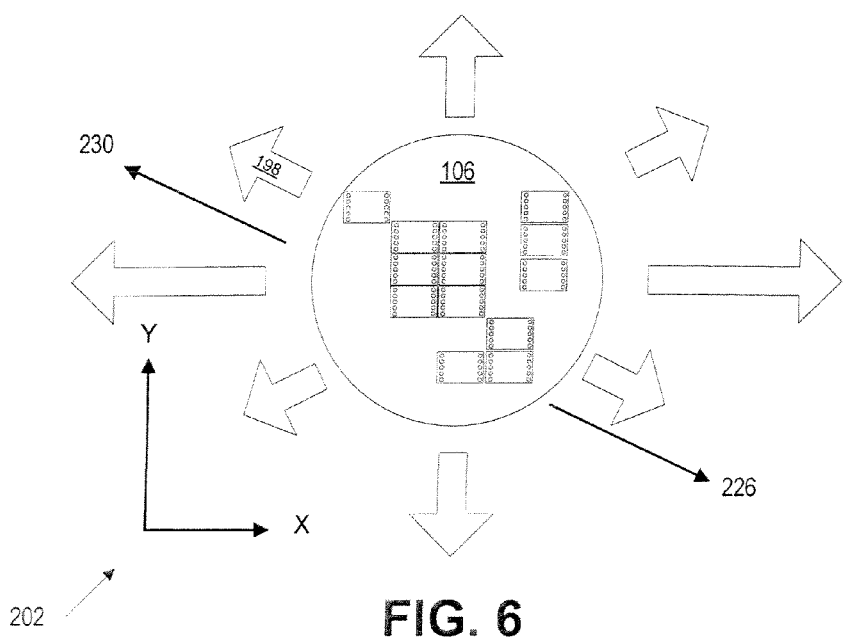
FIG. 6 illustrates a top view of a wafer within the prober testing system of FIG. 5.

FIG. 6 further illustrates a top view of the wafer 106 as shown within the system shown in FIG. 5. FIG. 6 further emphasizes the concept that lateral forces can be generated in any direction within the X-Y plane 202. The lateral force 198 described in FIG. 5 is shown in FIG. 6 in a top view perspective. As described, the lateral force 198 has an X-component vector in the negative X-direction 140 and a Y-component vector in the positive Y-direction 150. The lateral force 198 is parallel to the first direction 226 later described.

Figure 7:
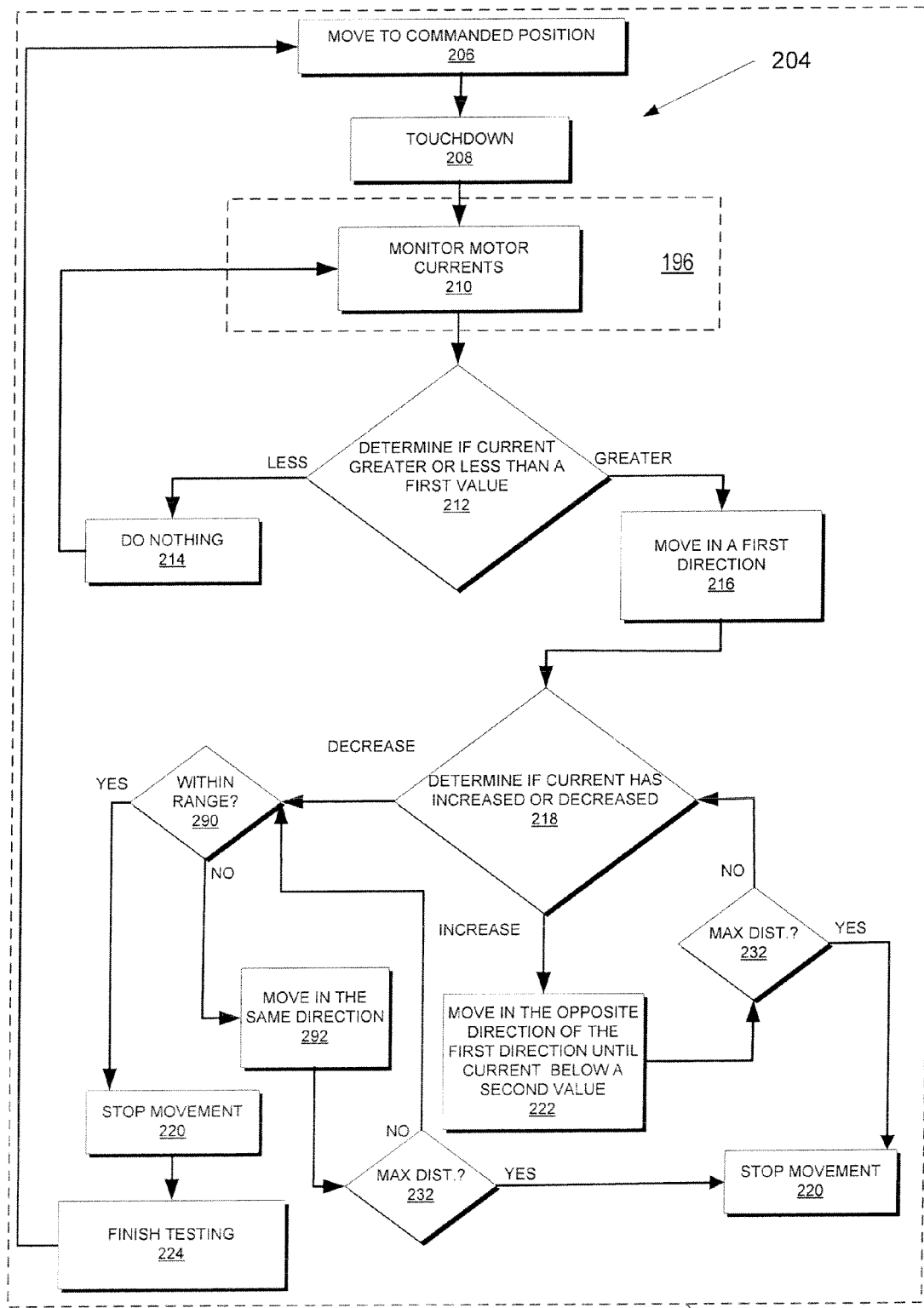
FIG. 7 illustrates a block diagram of a position control system.

FIG. 7 illustrates a compliance control process 204 within a position control system 228 where the wafer holder assembly 102 is moved to a commanded position 206. After the wafer 106 is moved to the commanded position, the motors are commanded to prevent movement in the X-direction 140 or Y-direction 150. A touchdown 208 occurs when the probe pins 158 engage with the conductive elements 110 as the Z-stage 120 raises the wafer 106. After touchdown 208, the monitoring module 196 begins to monitor a parameter of the X and Y motors 142,144. The parameter being monitored can be current, power, or voltage.

In one embodiment, the parameter being measured is current measured in amperes in a monitoring phase 210. As previously mentioned, if the current exceeds a critical value for a predetermined time period, the X and Y motors 142,144 will be shut down to prevent damage to the system 100, wafer 106, and motors 142,144. According to one embodiment, the critical value is about 4 amps.

During the monitoring phase 210, the monitoring module 196 collects measurements of the current from both X and Y motors 142, 144 at a sampling period of 10-50 milliseconds (ms) according to one embodiment, although any other time period can be used, such as 30 seconds. It is understood that a larger or smaller sampling period can be chosen according to demands or needs of the position control system 228 hardware.

After a first value measurement is taken by the monitoring module 196, the compliance control process 204 must determine 212 if the first value is within a threshold range. A threshold range, such as 0-3 amps, can be defined with the goal of maintaining the motor current within the threshold range. The threshold range can have an upper limit being an upper limit value 236. In one embodiment, the upper limit value 236 is about 3 amps if the normal operating current of the motor is about 2 amps and the critical value is 4 amps. If an upper limit value 236 is selected as 3 amps, a buffer zone of 1 amp is present between the upper limit value 236 of 3 amps and the critical value of 4 amps. It is understood that the upper limit value 236 can be chosen based on the type of motors being used, critical values associated with the type of motor, desired buffer zone, type of wafer 106 or conductive elements 110 being tested, probe card 128, probe pins 158 being used, or amount of downward vertical force generated in the system 100.

FIG. 7 further shows that if the measured current value is less than the upper limit value 236, the compliance control process 204 does not move the motors 142, 144 and does nothing 214 but monitor the motor currents 210 and maintain the stages in a motionless position. As a result, the compliance control process 204 continues to monitor 210 the motor 142, 144 currents and determine whether the current exceeds the upper limit value 236, such as 3 amps.

If the monitoring module 196 does measure a current value greater than the upper limit value 236, the position control system 228 will command 216 the X and Y motors 142, 144 to move in a first direction. Of course, it is possible to only command the X-motors 142 or Y-motor 144 to move individually in a first direction instead of both motors simultaneously. The first direction is a lateral direction which is perpendicular to a direction in which the stage 120 is separated from a component (such as the wafer 106) and the motor moves the stage 120 relative to the component.

After moving the Z-stage 120 in a first direction, the position control system 228 must determine 218 if there was an increase in motor current 194 or decrease with respect to the previously measured value that was above the upper limit value 236. If there has been a decrease in motor current 194 to within the threshold range 290, the motors 142,144 are commanded to stop movement and maintain its current position as a new commanded position. If there has been a decrease in motor current 194 but not within the threshold range 290, the motors 142, 144 can be commanded to move by another increment in the same direction 292 to further decrease the motor current 194. A predetermined total distance limit is checked 232 as will be described in further detail below.

After moving the Z-stage 120 in a first direction, if there is an increase in motor current 194, the motors 142,144 are commanded to move the Z-stage 120 in a second direction having a vector component opposite to the first direction. After moving the Z-stage 120 in the second direction, if the motor current 194 has decreased to within a threshold range 290 then the movement is stopped 220. The motors 142, 144 can be moved incrementally in the second direction until the motor current 194 has decreased to within a threshold range 290.

The incremental distance the Z-stage 120 can be moved by the motors 142, 144 is within 0.1 microns to 0.5 microns per increment. However, the value of incremental distance chosen is highly dependent on the encoder resolution being used to monitor the position of the Z-stage 120. It is possible that specific types of encoders can require an incremental distance outside of the range specified.

A predetermined total distance limit can be set within the position control system 228. If the total distance moved by the Z-stage 120 exceeds a predetermined maximum value, the position control system 228 can determine 232 the process is an error requiring further attention. The predetermined total distance limit can be defined according to the incremental distance resolution of the position control system 228. According to one embodiment, if a total distance in one direction exceeds 0.4-5 microns, the position control system 228 can flag the condition as an error and stop movement 220 to require the motors to be checked by an operator.

The above process can be conducted on both the X and Y motors 142, 144 simultaneously, separately, or in alternating order. For example, according to one embodiment, the X-motors 142 could be adjusted according to the process of FIG. 7 until the X-motors 142 have a motor current 194 within the threshold range after which the Y-motor 144 can be adjusted according to the same compliance control process 204. In another embodiment, the X-motors 142 can be adjusted for a specified period of time before the Y-motor 144 is adjusted for a specified period of time and then switching back to adjusting the X-motors 142 in an alternating fashion. In another embodiment, the X-motors 142 may be adjusted only, with no adjustment to the Y-motor 144. Alternatively, the Y-motor 144 can be adjusted only, with no adjustment to the X-motors 142.

The first direction for moving the Z-stage 120 can be randomly selected or can be based on historical or collected data relative to the type of motors being used, critical values associated with the type of motor, desired buffer zone, type of wafer 106 or conductive elements 110 being tested, probe card 128, probe pins 158 being used, or amount of downward vertical force generated in the system 100.

For example, if a specific type of probe pin 158 is empirically shown to push the Z-stage 120 in the direction of lateral force 198 shown in FIG. 6, then a bias can be programmed into the compliance control process 204 to select the direction of that lateral force 198 as the first direction.

Referring to FIG. 6, in one exemplary embodiment, the Z-stage 120 is moved in a randomly chosen first direction 226. As previously described, the Z-stage 120 is being pushed by internal lateral forces in a specific direction 230. Movement 226 of the Z-stage 120 in the first direction 226, in this example, would cause the lateral forces between the probe pins 158 and conductive elements 110 to increase and therefore cause the motor strain to increase. The movement 226 would increase the offset distance 168 between the first center axis 160 and second center axis 162 and therefore create higher motor current 194 within the motors 142,144 to maintain the Z-stage 120 in the commanded stage position.

The position control system 228 recognizes the increase in motor current 194 and determines 218 to move the Z-stage 120 and wafer 106 in a second direction 230 opposite to the first direction 226. The second direction 230, in this example, would be in the direction of lateral force 198 in FIG. 6. A movement in the second direction 230, having a vector component opposite the first direction 226, would reduce the magnitude of the lateral force 198 and therefore would cause a decrease in motor current 194. The position control system 228 may command the Z-stage 120 to continue to move incrementally (0.1-0.4 microns) in the second direction 230 until the motor current 194 is within a threshold range. However, if the position control system 228 determines 232 that the total distance moved by the Z-stage 120 is greater than a predetermined maximum allowable total distance (such as 5 microns), the position control system 228 will generate an error message and stop movement 220 of the system 100 for the motors 142,144 to be checked. However, if the motor current 194 stays below an upper limit value 236, such as 3 amps, the system 100 will remain motionless until the process is finished 224 when the probe pins 158 are disengaged from the conductive elements 110. After the process is finished 224, the Z-stage 120 is commanded back to a commanded position 206.

It is possible that a movement in a first direction and second direction will have no impact on reducing the motor current 194. In this case, the position control system 228 can be programmed to choose another direction having a vector component different from the first direction. For example, a perpendicular direction to the first or second direction could be used to determine if there is a decrease in motor current. Again, the direction chosen can be based on empirical data or historical information of the system 100 and components involved.

FIGS. 8a-8e show exaggerated views of various motor current 194 graphs that can result from the implementation of the compliance control process 204.

Figure 8A:
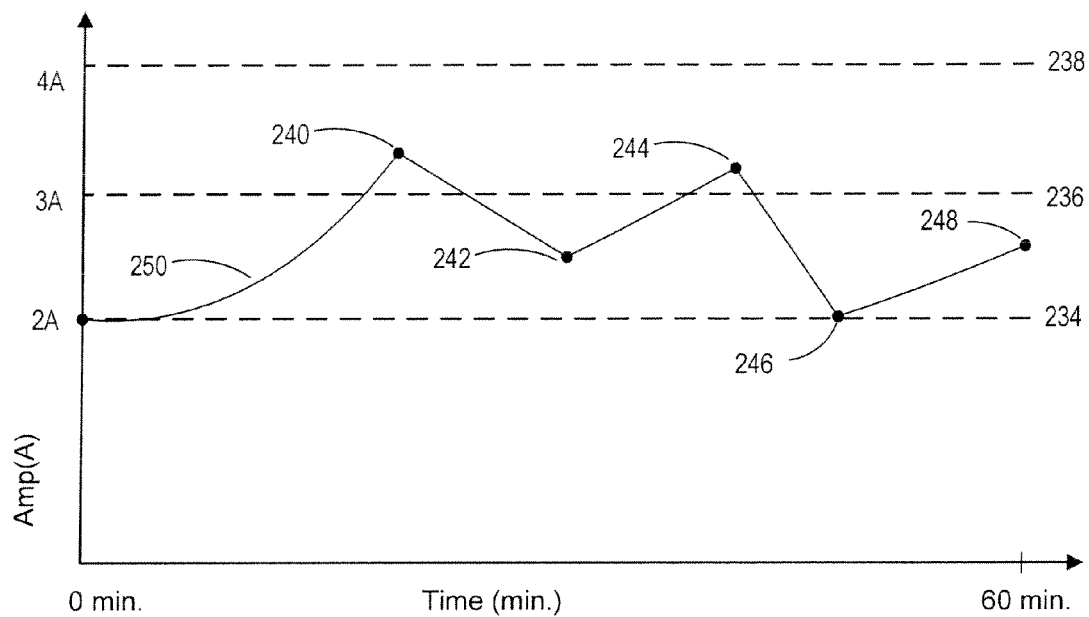
FIG. 8a illustrates a graph showing a change in motor current with respect to time, according to one possible embodiment.

FIG. 8a shows a graph of X-motor current 250 as a function of time (minutes) according to one embodiment. The total period of testing is one hour according to this example, although it is possible to define a total period to be less than one hour or multiple hours. The X-motor current 250 normal operating level 234 should be about 2 amps under normal operating conditions without any motor strain. After a period of time, the lateral forces between the probe pins 158 and conductive elements 110 build to a level causing the motor current 194 to gradually increase above an upper limit value 236 of 3 amps. The critical value 238 in this example is defined at 4 amps.

At a first point 240, the X-motor current 250 has increased beyond the upper limit value 236 of 3 amps. The compliance control process 204 selected a first direction to move the Z-stage 120 and wafer 106 thus causing the X-motor current 250 to immediately decrease below the upper limit value 236 of 3 amps and therefore the position control system 228 ceases to compensate and does not move the Z-stage 120. Thus, at a second point 242, the X-motor current 250 is still under 3 amps, within a threshold range, and therefore does not move the Z-stage 120. However, after the second point 242, internal system forces begin to build and increase to a level above 3 amps at third point 244. The position control system 228 moves the system in the same first direction immediately causing the X-motor current 2550 to decrease to the normal operating level 234 at the fourth point 246. The X-motor current 250 remains under the upper limit value 236 for the remaining time period and thus the Z-stage 120 remains motionless in the X-direction 140 until the fifth point 248 when the process is finished.

FIG. 8a emphasizes the fact that lateral forces may develop over time because of the sliding engagement between the probe pins 158 and conductive elements 110 under immense vertical force. Shifting alignments between the probe pins 158 and conductive elements 110 may cause lateral forces to change within the system 100 over time.

Figure 8B:
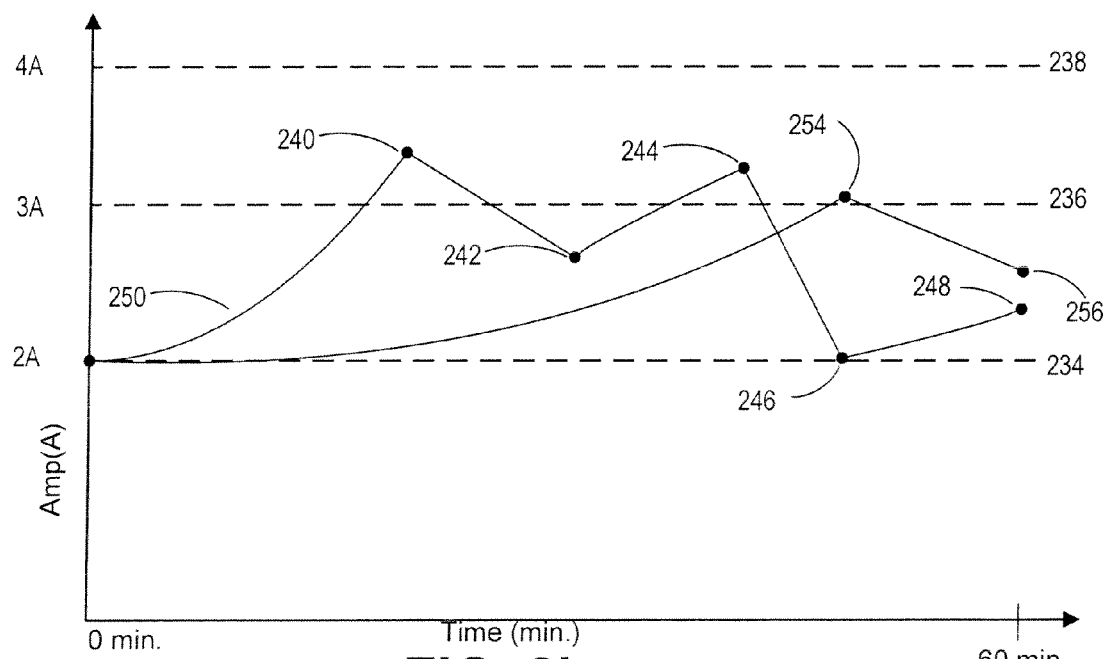
FIG. 8b illustrates a graph showing a change in two motor currents with respect to time, according to another possible embodiment.

FIG. 8b shows the same X-motor current 250 from FIG. 8a in addition to a Y-motor current 252. The Y-motor current 252 can be independent of the X-motor current 250 so that increases in the X-motor current 250 have not effect on Y-motor current 252. At a first Y-motor point 252, the Y-motor current has increased above the upper limit value 236 and therefore the compliance control process 204 is implemented with the Y-motor 144 only while the X-motor current 250 decreases to the normal operating value 234. At the end of the total period, the compliance control process 204 is successful in maintaining the X-motor current 250 and Y-motor current 252 below the upper limit value 236 at the final end points 248,256.

Figure 8C:
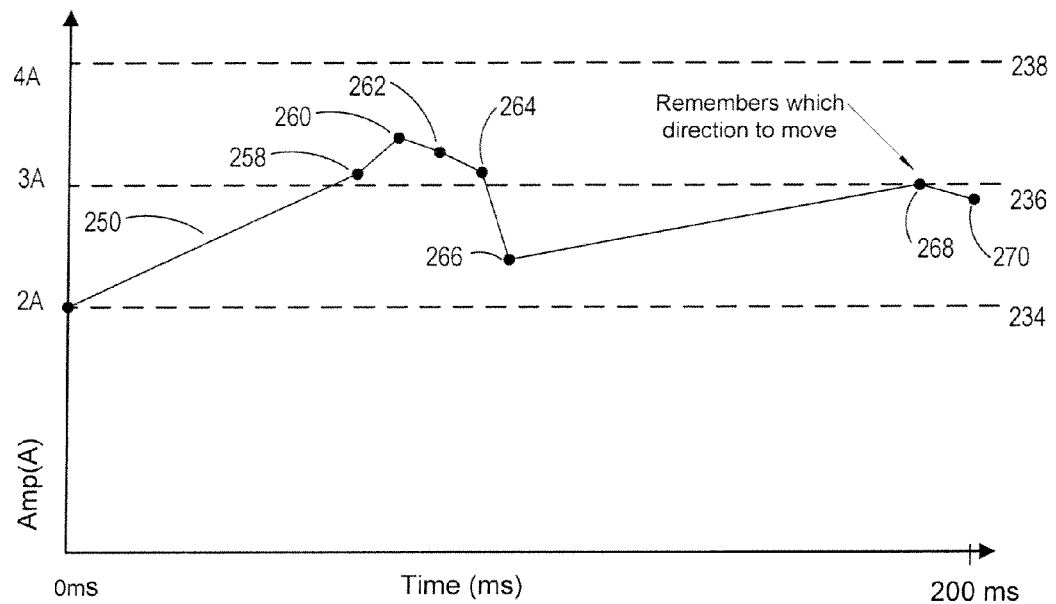
FIG. 8c illustrates a graph showing a change in motor current with respect to time, according to another possible embodiment.

FIG. 8c shows a graph of the X-motor current 250 as a function of time (ms) according to another example showing the implementation of the compliance control process 204. The Y-motor current 252 is omitted for ease of illustration. The graph also shows the normal operating level 234, upper limit value 236, and critical value 238 as previously described. The period of time shown in this example is 200 ms although it is recognized that the period of time shown is likely a small segment of a much larger testing period. The sampling period is 10 ms for illustrative purposes.

At a first point 258, the X-motor current 250 has increased to a value above the upper limit value 236. The position control system 228 selects a first direction to move the Z-stage 120 at the first point 258. When the X-motor current 250 is measured at a second point 260 (10 ms after the first point 258), the X-motor current 250 has increased relative to the first point 258. Therefore, the Z-stage 120 is moved by the X-motors 142 in a second direction opposite the first direction by an increment of 0.1-0.4 micrometers (depending on system capabilities).

The third point 262 shows a decrease from the second point 260; however, the X-motor current 250 is still measuring above the upper limit value 236. In response, the position control system 228 commands the X-motors 142 to move in the same direction 292 as the second direction by another increment causing the X-motor current 250 to decrease to a fourth point 264. However, at the fourth point 264, the X-motor current 250 is still above the upper limit value 236. Therefore, the Z-stage 120 is moved another increment in the second direction causing the X-motor current 250 to reach a value at the fifth point 266 below 3 amps within a threshold range, at which point the Z-stage 120 is maintained in a stationary position.

If the X-motor current 250 eventually increases to a sixth point 268 above 3 amps, the position control system 228 can be programmed to recall from memory the previous movements to determine that a movement in the second direction will most likely create a decrease in X-motor current 250. Therefore, the X-motors 142 can move the Z-stage 120 in the second direction to reduce the X-motor current 250 to the seventh and final point 270.

Figure 8D:
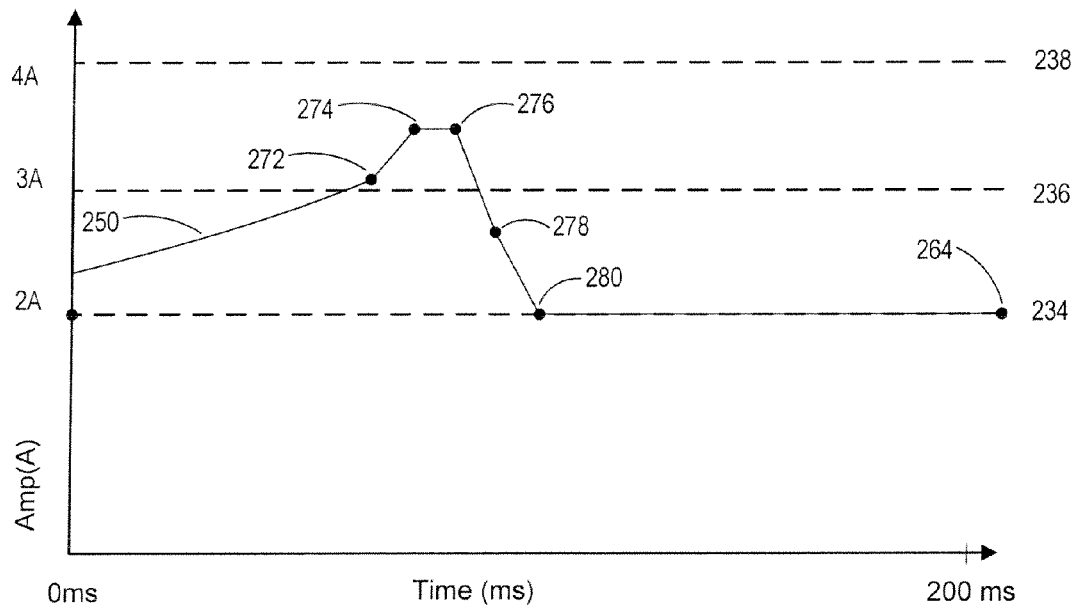
FIG. 8d illustrates a graph showing a change in motor current with respect to time, according to another possible embodiment.

FIG. 8d shows a graph of the X-motor current 250 as a function of time (ms) according to another example illustrating the implementation of the compliance control process 204. The X-motor current 250 increases to a first point 272 located above the upper limit value 236 which is 3 amps in this example. The threshold range of values below 3 amps is defined. The position control system 228 commands the X-motor 142 to move the Z-stage 120 in a first direction. As a result, the X-motor current 250 increases to a second measuring point 274 when the position control system 228 commands the X-motor 142 to move in a second direction opposite to the first direction by a predefined distance increment previously described.

At a third measuring point 276, the X-motor current 250 has not increased or decreased but has stayed the same. The X-motor current 250 at the third point 276 is equal to the X-motor current 250 at the second point 274. Therefore, the position control system 228 commands the X-motors 142 to move the Z-stage 120 by another increment in the second direction which results in the decrease of the X-motor current 250 to the fourth point 278. Because the fourth point 278 is below the upper limit value 236, the position control system 228 does not communicate any commands to the Z-stage 120. At a fifth measuring point 280, the X-motor current 250 has dropped to the normal operating level 234 and maintains a current value of 2 amps until the completion of testing at the sixth point 282 with no significant change in X-motor current 250.

In another embodiment, it could be possible to leave the Z-stage 120 motionless if there is no increase or decrease between the second point 274 and third point 276. However, if the X-motor current 250 were to increase at a later measuring point, the Z-stage 120 would be moved in the second direction in an effort to decrease the X-motor current 250.

Figure 8E:
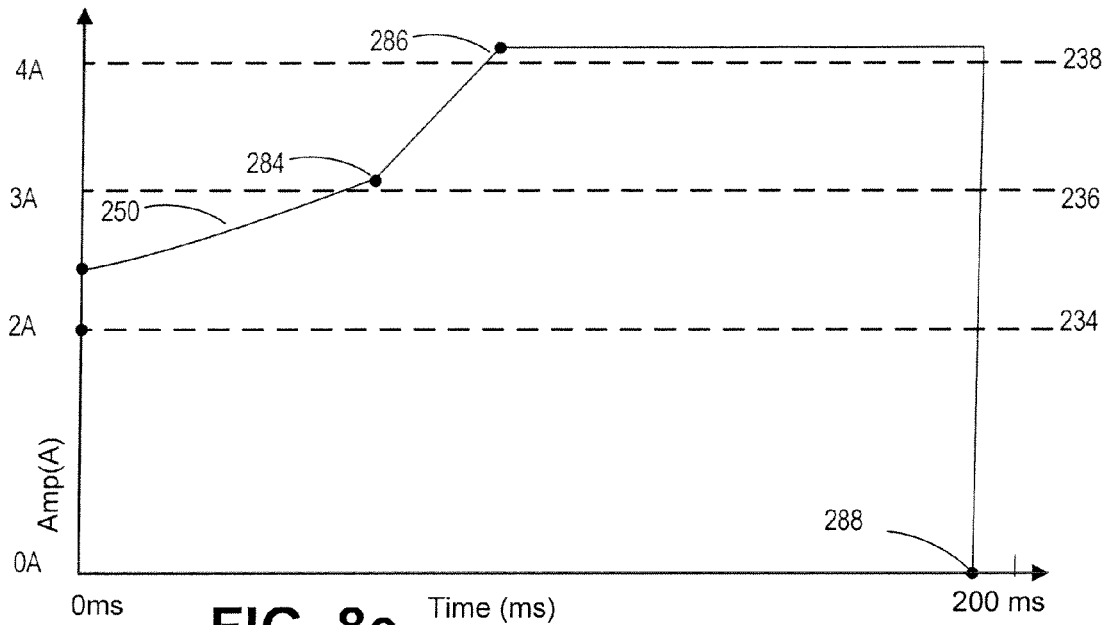
FIG. 8e illustrates a graph showing a change in motor current with respect to time, according to another possible embodiment.

FIG. 8e shows an example where the position control system 228 moves the Z-stage 120 in a first direction after reaching a first point 284 that is located above the upper limit value 236. It is possible that the X-motor current 250 can spike to a second point 286 at the critical value 238 where system 100 damage is a potential problem. In this situation, if the X-motor current 250 remains above the critical value 238 for greater than 10-50 ms, an over-current error message can be generated to cause the position control system 228 to stop movement 220 for the X-motors 142 to be checked or the entire system 100 can be powered off causing the X-motor current 250 to drop to a zero point 288. Again, powering off is highly undesirable due to loss of encoder information.

Figure 8F:
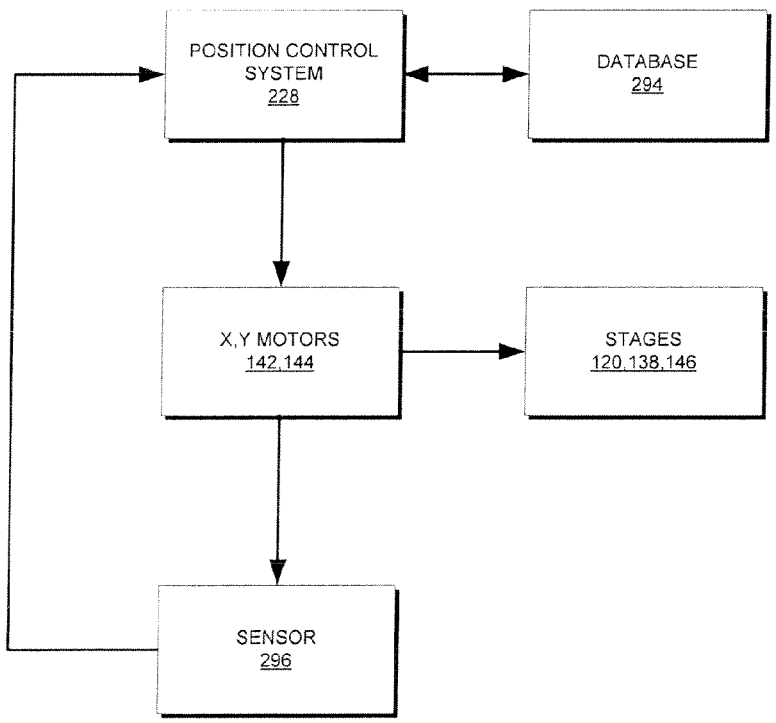
FIG. 8f illustrates a block diagram of a feedback system.

FIG. 8f shows a feedback system where the position control system 228 communicates with the X and Y motors 142, 144. The motors 142, 144 communicate with the stages 120, 138,146 to move to a commanded position and to move in incremental steps previously described. A sensor 296 measures the motor current 194 and sends information to the position control system 228 in a feedback loop. The motor current 194 is monitored by the monitoring module 196 within the position control system 228. The position control system 228 records motor current 194 and movements in the database 294. The position control system 228 may be a general purpose or special purpose data processing system which is programmed (e.g. with a software program) or otherwise configured to perform one or more of the methods described herein. The position control system may include a processor(s) and a bus coupled to the processor(s) and a memory (e.g. RAM or flash memory, etc.) coupled to the bus and to the processor(s). The software program, if used, includes executable program instructions which when executed cause a data processing system to perform one or more of the methods described herein. The software program instructions may be stored in a machine readable storage medium such as a RAM, flash memory, or other storage media.

The position control system is, in one embodiment, in constant two-way communication with a database 294 so that movements can be based on the database information such as historical or empirical data. By retaining the motor current 194 and movement information, the position control system 228 can determine the best direction to move the Z-stage 120 for all movements while minimizing motor current 194. The position control system 228 can also determine different incremental movement distances based on historical or empirical data within the database 294.

In an effort to improve test reliability and include more features on devices under test or processing, a large number of probe tips are generally used with a relatively long contact time.

The position control system 228 can be implemented in "direct write" operations such as ink jet, nozzle dispensing processes, aerosol spray coating, soft lithography, laser guidance approaches, AFM dip-pen techniques, or any technique or process capable of depositing, dispensing, or processing different types of materials over various surfaces following a preset pattern or layout. The position control system 228 can adjust for any force generated within a direct write system that may otherwise cause manufacturing errors. The position control system 228 can be applied to fabrication systems for electronic devices, sensors, MEMS devices, and other known devices.

The position control system 228 can be used with systems handling a broad range of materials such as all types of glass and metal, alloys, semiconductors, crystals, synthetic materials, ceramics, plastics, and natural organic materials including biological material.

Advantages of the present invention include being able to accommodate probe tips that generate excessive horizontal probing force over time while avoiding the triggering of test safety criteria which terminate the test undesirably.

Another advantage of the present invention allows long contact times required for rigorous testing without interruption. The present invention avoids forces that will stretch both pad surface and probe tips in an undesired direction and thereby shorten the life time of the components.

The present invention is highly desirable because abnormal terminations can be avoided and damage to the test components can also be avoided.

In a typical system the connections joining the different components are likely to exhibit flexibilities. Because the connections between components are not perfectly rigid there will be vibrationary or flexural relative displacements between the components of the system when a part of the system is exposed to a disturbance. The flexural deflections may in turn cause non-compensatory dislocations between the wafer pad and the probe card pins, thus degrading performance.

Figure 9:
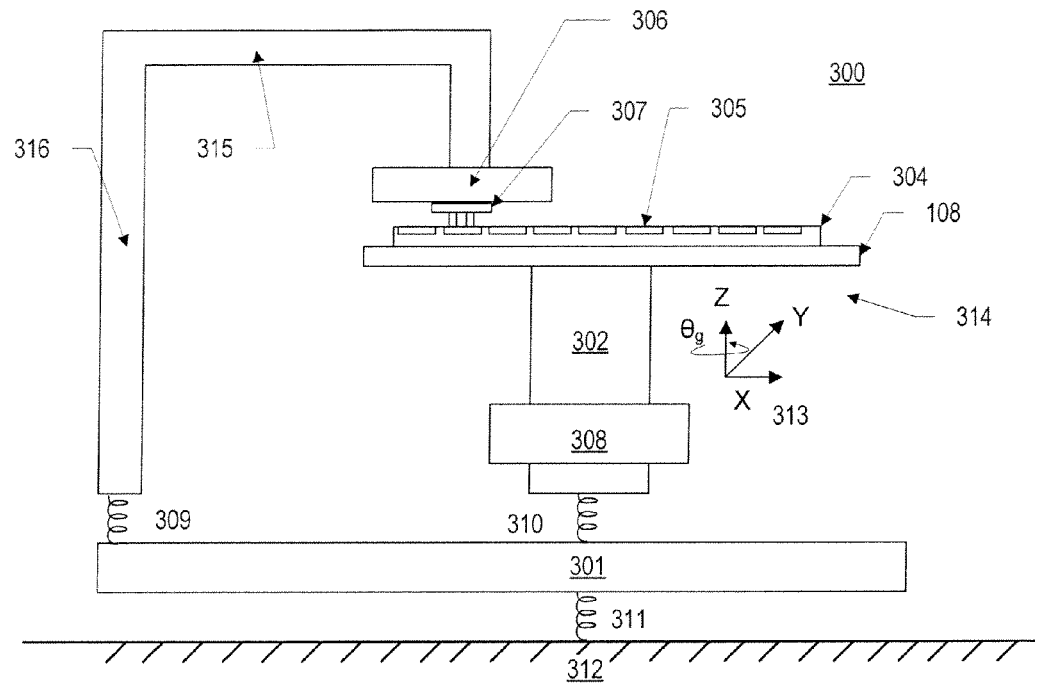
FIG. 9 illustrates a side view of a possible embodiment of a prober testing system with added flexibilities between various components.

FIG. 9 depicts a possible embodiment of a probing system 300 presenting flexural connections between some of the various components. A number of exemplary non-rigid connections between some of the components are shown in FIG. 9. Thus, the joint 310 between the Z stage 302 and the granite base 301 is illustrated with a spring symbol 310 to indicate the flexural (and vibratory) nature of the joint. The actuation system 308 is connected to the gantry system. Similarly, the connection 309 between the Probe-card Holder Assembly (PHA) stage 315,316 and the granite base 301 of the Wafer Holder Assembly (WHA) stage 314 as well as the joint 311 between the granite base 301 and the floor 312 are also illustrated with spring symbols. It will be understood that actual physical springs are not present but that the joints may be modeled or represented by these springs. The coordinate system 313 is illustrated for clarity. A probe card holder chuck 306 maintains a probe card 307 against the bond pads 305 on a wafer 304.

Unwanted relative displacements can be reduced by increasing the flexural rigidity of the connections, or by providing isolation between the floor and the system. These methods have the disadvantage of requiring an increase in the weight of the system (thereby raising the sensitivity in the frequency domain to motion disturbances), and of requiring a change in the isolation properties at installation of a probing system. A less costly and complex solution that would reduce the effect of unwanted vibrations is to actively suppress or compensate for the motion disturbances via a sensing and control system.

In a possible embodiment of another aspect of the invention, disturbance measurement devices can be added to several locations on the probing system. For example, one sensor could be placed on the granite base, another on the XYZ motion mechanism on the gantry system and a third on the probe pin locating interface. Disturbance amplitude and phase information is measured continuously at all three locations and along different directions (X, Y and Z). The sensing information could be input into the motion controller through low pass filters to eliminate high-frequency noise in the signals. The controller would then process the relative amplitude and phase information to apply compensatory corrections to the system in the X,Y,Z or theta directions through the motion mechanism's existing actuation drives. The resultant motion is devoid of all uncontrolled relative displacements between the wafer substrate and the probe pins. In addition, the corrections would allow the system to step from die to die on the wafer much faster because the accelerometers would also be used to cancel out the reaction forces (internal disturbances) as the wafer chuck moves from probing one die to a position to probe the next die.

Figure 10:
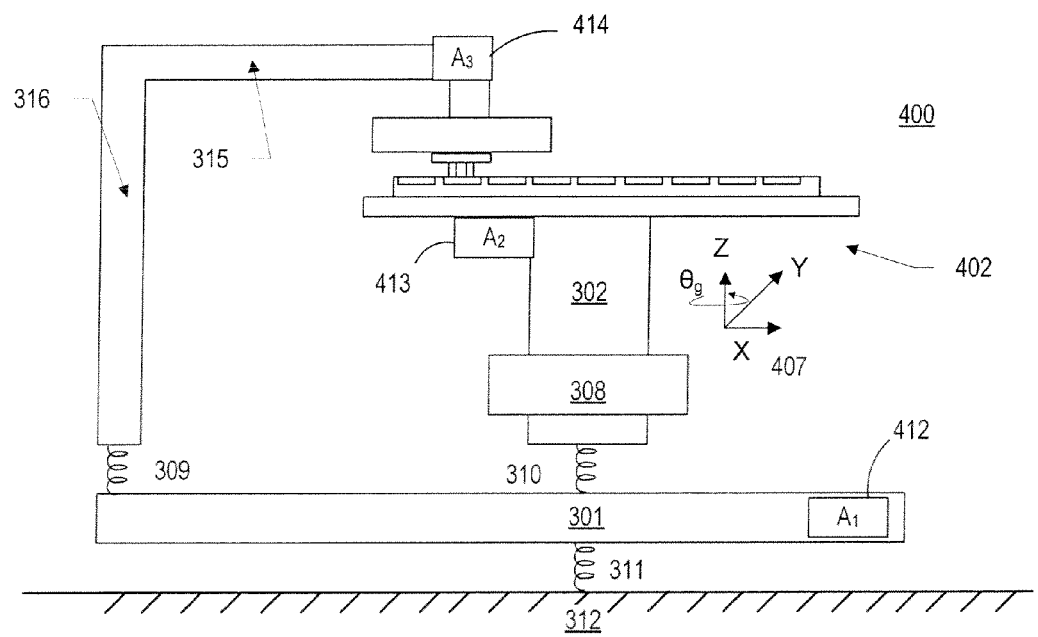
FIG. 10 illustrates an embodiment of acceleration sensing in a prober testing system with flexible connections.

FIG. 10 shows the same side view of the exemplary probing system presented in FIG. 9 with the addition of accelerometers at three different locations on the system. The boxes $A_1$ 412, $A_2$ 413 and $A_3$ 414 represent three accelerometers added to measure the motion of the granite base 301, the bridge/chuck/wafer assembly 402 (which can be assumed to be rigidly connected and thus considered as a single vibratory element) and the PCHA stage 315, respectively. The coordinate system 407 is shown for clarity.

The addition of these three sensors allows quantification of the magnitude and phase of the vibratory accelerations and/or velocities induced at each of these three locations by an external or internal disturbance. Similarly, the measurements can be used to derive the relative acceleration, velocity, magnitude and phase between the measured components. Both types of measurement, individual and relative, can be used in different control schemes to compensate for unwanted displacements.

It would be possible in another embodiment of the same aspect of the invention to alternatively use velocity sensors or a combination of velocity and acceleration sensors or different numbers of sensors and at different locations. It will also be appreciated that such sensors may be used to compensate for motion disturbances in wafer probing systems which use sawyer motors (rather than a gantry system) to move one or both of the wafer chuck and the probe card platform relative to each other.

Figure 11:
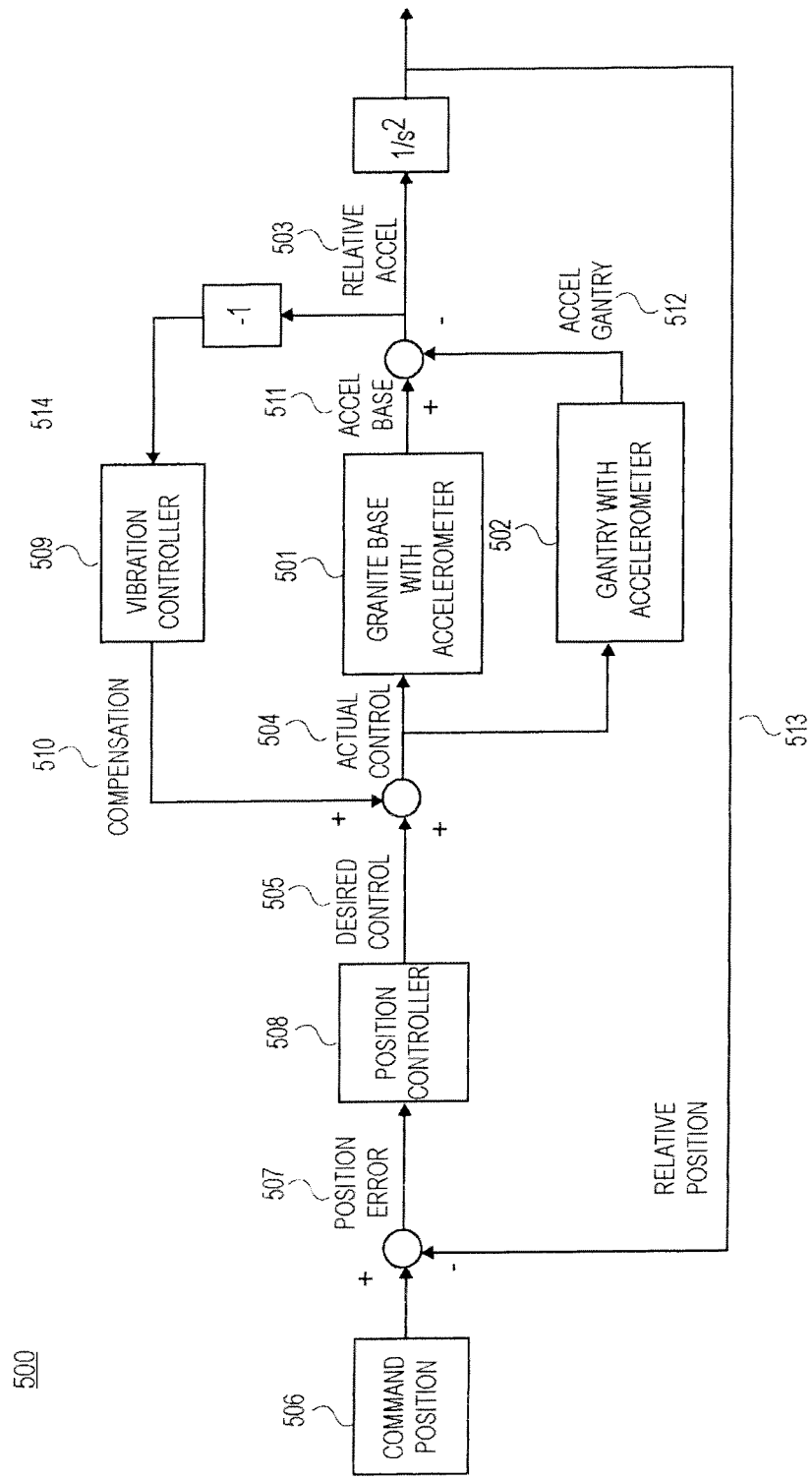
FIG. 11 illustrates a block diagram of a feedback control scheme incorporating relative acceleration compensation.

FIG. 11 shows a block diagram of a possible embodiment of a control system incorporating acceleration information from two sensors 501 and 502 located at the granite base and the gantry, respectively. This particular embodiment serves to illustrate another aspect of the invention, namely a control scheme designed to eliminate contact position disturbances during operation. In the particular illustrative embodiment shown in FIG. 11, the controller consists of two main loops: a position control loop 513 with its own position controller 508 and an acceleration control loop 514 with its own vibration controller 509.

As explained above, the Z stage is attached to the bridge of the gantry system and is floating on the granite base. The gantry is here assumed to comprise the bridge/chuck/wafer assembly 402 of FIG. 10. When the actuation motors drive the gantry forward, the same amount of traction force will act on the granite base with reverse direction (by Newton's third law of motion). This can be considered an internal disturbance. Similarly, any external disturbance acting on the base (for example from floor shaking) will also appear in the gantry because of the traction force between the gantry and the granite base. Because of the non-rigid connection between the gantry and base, vibratory relative displacements will be induced by such disturbances.

The design objective of the compensation scheme shown in FIG. 11 is to ensure that both the gantry and the granite base have the same amplitude and phase, that is, the control system is compensating for (or eliminating) the relative vibrations between the gantry and base.

For the purposes of this particular illustrative embodiment of this aspect of the invention, it will be assumed that the there is a rigid connection between the granite base and floor, and both will be viewed as a single spring-mass system with a mass $M_{EQ}$ and a stiffness $K_{EQ}$. The stiffness $K_{EQ}$ would correspond to the spring 310 shown in FIG. 10 between the base and gantry.

The floor/base structure can move relative to the mass of the gantry, which for this illustrative example will be assumed to be a linear system with mass $M_{Gantry}$ and no stiffness of its own. Based on the above assumptions, the dynamics of the gantry relative to the granite base, termed $G_{Gantry\text{-}on\text{-}Granite}$ (which will produce the relative motion between the base and gantry that the controller in FIG. 11 is designed to suppress), can be written in the frequency domain as the following transfer function:

$$G_{Gantry\text{-}on\text{-}Granite}(s) = \frac{Acc_{Relative}(s)}{F_{Actual}(s)} \quad (1)$$
$$= G_{Gantry}(s) + G_{Granite}(s)$$
$$= \frac{1}{M_{Gantry}} \left( \frac{\frac{s^2}{\omega_2^2} + 1}{\frac{s^2}{\omega_1^2} + 1} \right)$$

where:

$Acc_{Relative}(s)$ is the relative acceleration 503 between the base and gantry obtained by subtracting the accelerometer readings of the base 511 and gantry 512.

$F_{Actual}(s)$ is the control force 504 applied to the base and gantry resulting from the combined action of the Compensation force 510 and the Desired Control force 505.

$G_{Gantry}(s)$ is the transfer function of the dynamics of the gantry.

$G_{Granite}(s)$ is the transfer function of the dynamics of the floor/base.

$\omega_1 = \sqrt{K_{EQ}/M_{EQ}}$ is the resonant frequency of the floor/base structure.

and $\omega_2 = \sqrt{K_{EQ}/(M_{EQ}+M_{Gantry})}$ is the resonant frequency of the gantry and floor/base masses combined.

Given the resonance (or poles, obtained by calculating the roots of the denominator) of Eq. (1), which will be a combination of $\omega_1$ and $\omega_2$, it would be difficult for a servo controller (which in FIG. 11 is a combination of a Position Controller 508 and a Vibration Controller 509) to obtain perfect tracking (i.e. zero position error 507) of a commanded position 506. Therefore, it would be desirable to design a compensation 510 that will also linearize the dynamics between the Desired Control 505 and Relative Acceleration 503 signals in FIG. 11. In that case, the servo controller would have an ideal (zero) error control. In another aspect of the invention, an embodiment of the control scheme would involve such linearization.

Figure 12:
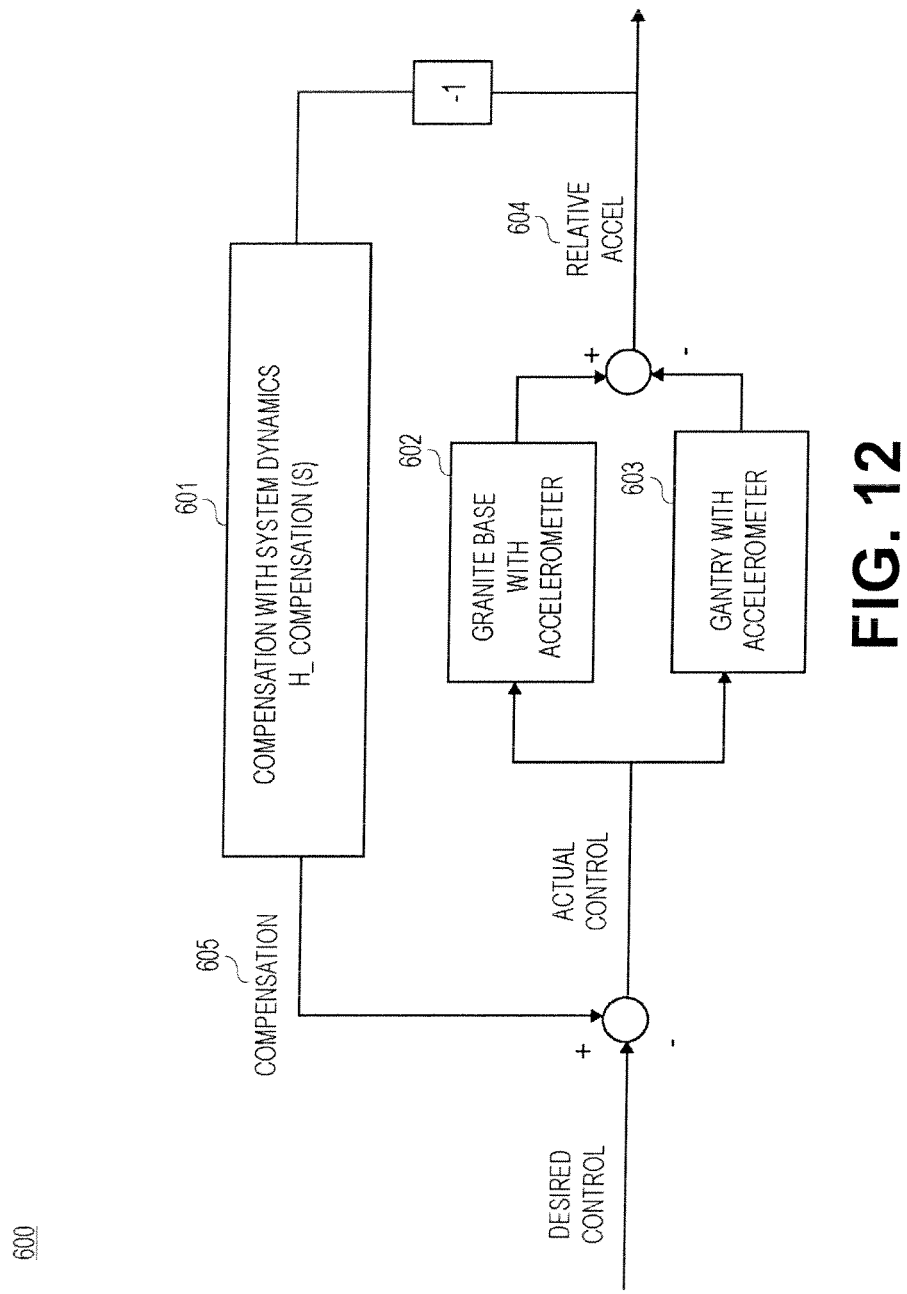
FIG. 12 shows block diagram details of an acceleration compensation scheme based on relative acceleration measurements.

FIG. 12 shows the block diagram of a possible embodiment of a compensation control 601, termed $H_{Compensation}$ (and equivalent to the Vibration Controller 509 in FIG. 11), designed to linearize the relative dynamics 604 between the base 602 and gantry 603 and thus eliminate the resonance. The resulting Compensation 605, or $F_{Compensation}$, can be designed as follows:

$$F_{Compensation} = M_{Gantry} \times Acc_{Granite} \qquad (2)$$

where $Acc_{Granite}$ is the acceleration of the granite base.

Equation (2) is insensitive to the resonance frequency, as desired. Incorporating the relative dynamics of the gantry and base, $G_{Gantry-on-Granite}$, into Equation (2) the compensation control, $H_{Compensation}$ 601 can then derived as follows:

$$H_{Compensation}(s) = \frac{F_{Compensation}(s)}{Acc_{Relative}(s)} \qquad (3)$$
$$= M_{Gantry} \cdot \frac{G_{Granite}(s)}{G_{Gantry-on-Granite}(s)}$$

The equivalent system dynamics with the above compensation, termed $\hat{G}_{gantry-on-granite}$, is then:

$$\hat{G}_{Gantry-on-Granite}(s) = \frac{G_{Gantry-on-Granite}(s)}{1 + G_{Gantry-on-Granite}(s) H_{Compensation}(s)} \qquad (4)$$

Hence, the resultant system dynamics with compensation (substituting Equations (2) and (3) into Equation (4)) will be:

$$\hat{G}_{Gantry-on-Granite}(s) = \frac{1}{M_{Gantry}} \qquad (5)$$

Comparing the relative dynamics with compensation $\hat{G}_{Gantry-on-Granite}$ in Equation (5) and the dynamics without compensation $G_{Gantry-on-Granite}$ in Equation (1), it is clear that the resonance caused by traction forces and external disturbances will be eliminated with the above compensation $H_{Compensation}$. In practice, $H_{Compensation}$ is expected to lead to an ideal linear system and thus to improved position tracking even when disturbances are present and continuous and during operation while the probe pins are contacting the bonding pads.

Figure 13:
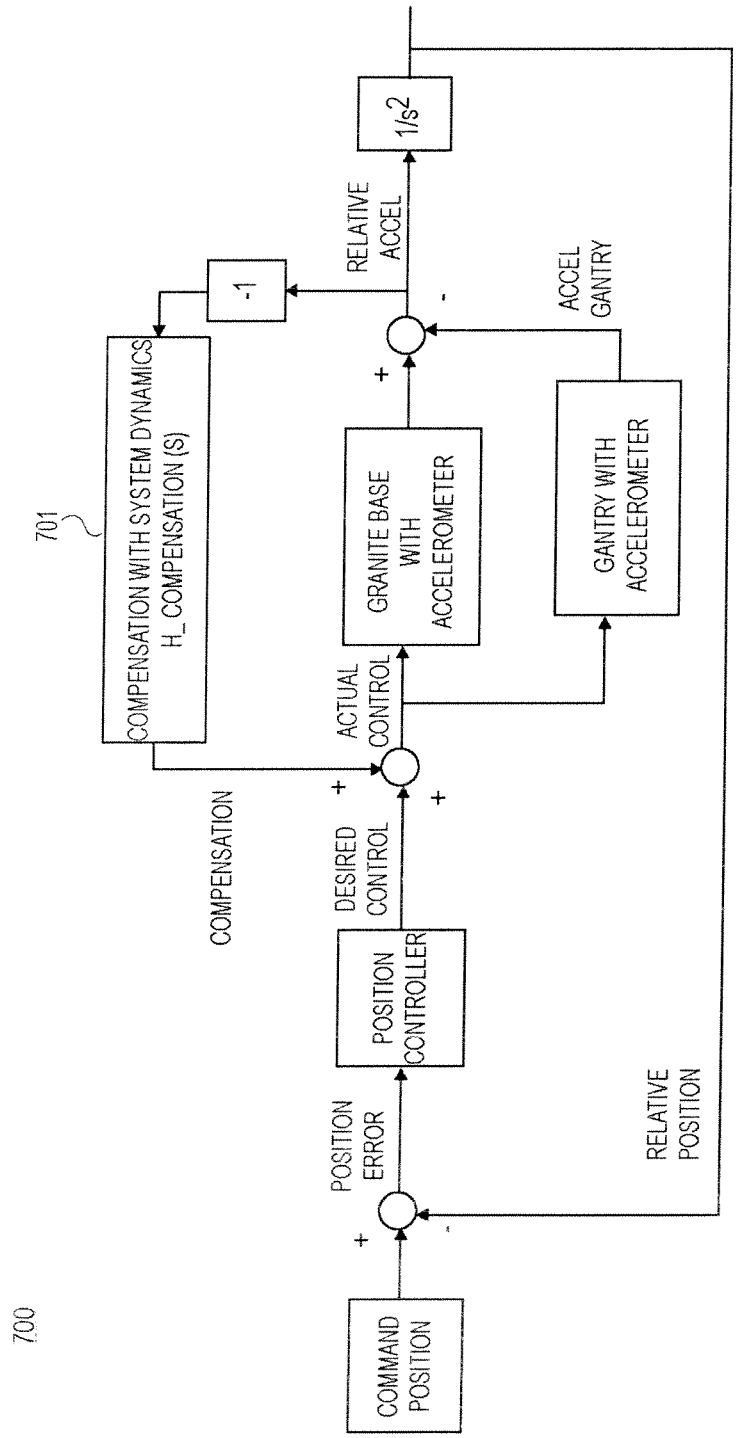
FIG. 13 shows the block diagram of the equivalent acceleration loop in FIG. 12 by adding acceleration based compensation.

FIG. 13 shows the complete control block diagram when the acceleration based compensation control 601 of FIG. 12 is incorporated 701 into the entire control scheme of FIG. 11.

Other embodiments of control systems incorporating the readings of multiple sensors of same or other kinds in order to achieve the accurate and continuous positioning of wafer pads relative to probe pins in any direction and in the presence of motion disturbances are also covered by the present invention. Similarly, other control schemes compensating for individual (non-relative) or relative accelerations of different components in the system in different ways that result in active suppression of motion disturbances in a probing system are also covered by the present invention.

Figure 14:
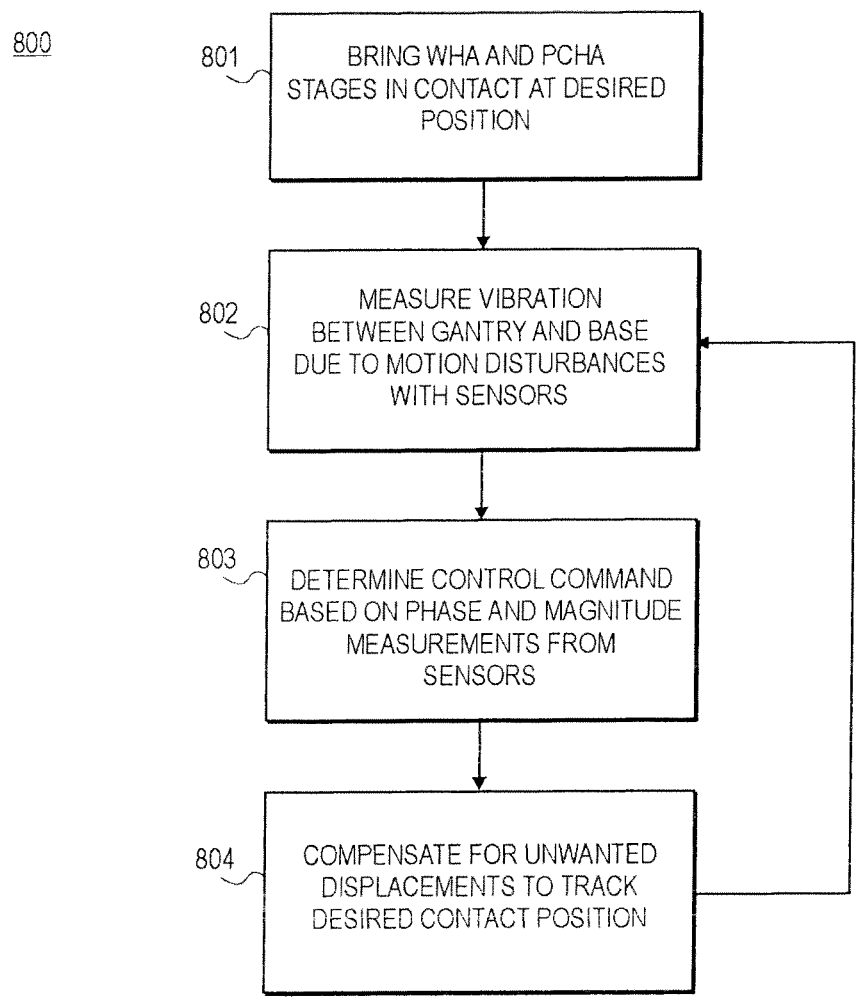
FIG. 14 illustrates a flow diagram showing exemplary operations of a testing system that accurately maintains a desired probe-to-pad position by incorporating motion disturbance sensing and compensation.

FIG. 14 is a flow diagram showing a possible embodiment of the processes involved in a testing system making use of sensors and a control system to compensate for motion disturbances on the WHA stage. As a first operation 801, the WHA and PCHA stages are brought in contact until the desired contact position and force is achieved. In order to maintain that desired contact position, any vibration (magnitude and phase) between the gantry and base are continuously measured 802 to detect changes in the desired contact position due to motion disturbances such as floor shaking or actuation of the gantry. A control system then determines the required corrective action based on the sensor information 803. The corrective forces are then applied to the gantry via actuators incorporated in the WHA stage to eliminate any unwanted position disturbances and to track the desired position 804. Operations 802-804 are continually repeated (for example every 50 milliseconds), in at least certain embodiments, to ensure that any disturbances to the desired position are promptly corrected. These operations (802-804) are also performed repeatedly (e.g. every 50 milliseconds) as the WHA and the PCHA stages are moved relative to one another in order to step from die to die to position the probe tips over a new set of bonding pads in the probing process. Other embodiments where other parameters and components of the system are monitored and controlled are also possible.

The methods described herein can be performed by a data processing system, such as a general or special purpose computer, operating under software control where the software can be stored in a variety of computer readable media.

The various embodiments of the inventions may be used on wafer probers having wafer chucks which hold full wafers or other types of probing systems such as systems which probe die or dice on film frames (which are flexible) or strips (which may be rigid).

Thus, apparatuses and methods have been provided for achieving and maintaining the accurate pad to probe contact positioning in a testing system in the presence of disturbances. Although the present invention has been described with reference to specific exemplary embodiments, it will be evident that various modifications and changes may be made to these embodiments without departing from the broader spirit and scope of the invention as set forth in the claims. Accordingly the specification and drawings are to be regarded in an illustrative rather than a restrictive manner.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A machine-implemented method of modifying a stage position, comprising:
   determining one or more of: a type of conductive element to test, type of probe card, and type of probe pin;
   measuring, by a data processing system, at least one parameter of a motor connected with a stage during a first commanded stage position, the motor configured to move the stage; and
   moving the stage from the first commanded stage position to a modified commanded stage position in a first direction in response to reaching a threshold value of the at least one parameter of the motor, the threshold value of the at least one parameter of the motor determined based on the one or more of:

the type of conductive element to test, type of probe card, and type of probe pin.

2. The machine-implemented method of claim 1, further comprising moving the stage in a second direction which has a vector component that is opposite to the first direction, in response to a change in the at least one parameter.

3. The machine-implemented method of claim 1, wherein the first direction is a lateral direction which is perpendicular to a direction in which the stage is separated from another component and the motor moves the stage relative to the another component.

4. The machine-implemented method of claim 1, wherein the at least one parameter is one of voltage or current.

5. The machine-implemented method of claim 1, wherein the commanded stage position is obtained by the motor moving the stage to the commanded stage positions.

6. The machine-implemented method of claim 1, further comprising measuring, by the data processing system, the at least one parameter after moving the stage in the first direction to determine whether there was an increase or decrease in the at least one parameter and wherein the stage is positioned by the motor relative to another component.

7. The machine-implemented method of claim 6, wherein the stage receives a first force from a structure on the another component and the force causes the at least one parameter to increase over time.

8. The machine-implemented method of claim 7, wherein the structure is a probe pin and the another component is a probe card.

9. The machine-implemented method of claim 7, wherein the first force is generated by an interaction between the structure on the another component and a contact bump, the first force having a vector component in a direction parallel to the first direction.

10. The machine-implemented method of claim 7, wherein the stage receives a second force, the second force having a vector component in a direction perpendicular to the first direction, the second force being at least 50 kgf.

11. The machine-implemented method of claim 1, further comprising determining, by the data processing system, whether the at least one parameter is within a threshold range.

12. The machine-implemented method of claim 11, further comprising moving the stage in a second direction which has a vector component that is opposite to the first direction if the at least one parameter is not within the threshold range.

13. The machine-implemented method of claim 11, further comprising monitoring, by the data processing system, a total distance moved by the stage and stopping the movement of the stage if a predetermined total distance limit is met.

14. The machine-implemented method of claim 11, wherein the at least one parameter is current and the threshold range is less than 4 amps.

15. The machine-implemented method of claim 11, further comprising maintaining the stage in a motionless position if the at least one parameter is within the threshold range.

16. A machine-implemented method of modifying a stage position, comprising:
    determining one or more of: a type of conductive element to test, type of probe card, and type of probe pin;
    measuring, by a data processing system, at least one parameter of a motion control system connected with a stage during a first commanded stage position, the motion control system configured to move the stage; and
    moving the stage from the first commanded stage position to a modified commanded stage position in a first lateral direction in response to reaching a threshold value of the at least one parameter of the motion control system, the threshold value determined based on the one or more of: the type of conductive element to test, type of probe card, and type of probe pin.

17. The machine-implemented method of claim 16, further comprising moving the stage in a second lateral direction being opposite to the first direction, in response to a change in the at least one parameter.

18. A system of modifying a stage position, comprising:
    a frame;
    a base supported by the frame;
    a stage having a command position and being supported by the base;
    at least one motor having at least one parameter, the motor being configured to move the stage in a first direction; and
    a position control system coupled with the stage and configured to:
        determine one or more of: a type of conductive element being tested, type of probe card, and type of probe pin; and
        communicate with the at least one motor to modify the command position of the stage in response to reaching a threshold value of the at least one parameter, wherein modifying the command position of the stage results in a change in the at least one parameter that is communicated to the position control system, wherein the threshold value is based on the one or more of: the type of conductive element to test, type of probe card, and type of probe pin.

19. An apparatus comprising:
    a frame;
    a base supported by the frame;
    a stage having a command position and being supported by the base,
    the stage being configured to move in a three-dimensional coordinate system; and
    at least one motor having at least one parameter being measured while the stage is in a command position, the motor being configured to move the stage in a first direction while the stage is in a command position in response to reaching a threshold value of the at least one parameter, the threshold value based on one or more of: a type of conductive element to test, a type of probe card, and a type of probe pin.

20. The apparatus of claim 19, wherein the command position is when the stage is in contact with a probe device during a testing process of a device.

21. A non-transitory machine readable medium having stored thereon data representing sequences of instructions, which when executed by a computer system cause the computer system to perform a method comprising:
    determining one or more of: a type of conductive element to test, type of probe card, and type of probe pin;
    measuring at least one parameter of a motor during a first commanded stage position of a stage; and
    moving the stage from the first commanded stage position to a modified commanded stage position in a first direction in response to reaching a threshold value of the at least one parameter, the threshold value determined based on the one or more of: the type of conductive element to test, type of probe card, and type of probe pin.

22. The medium of claim 21, further comprising measuring the at least one parameter after moving the stage in a first direction to determine whether there was an increase or decrease in the at least one parameter.

23. The medium of claim 21, further comprising moving the stage in a second direction that is opposite to the first direction, in response to a change in the at least one parameter.

* * * * *